US010659079B2

(12) United States Patent
Hsu et al.

(10) Patent No.: US 10,659,079 B2
(45) Date of Patent: May 19, 2020

(54) QC-LDPC CODES

(71) Applicant: Mediatek Inc., Hsin-Chu (TW)

(72) Inventors: Cheng-Yi Hsu, Hsinchu (TW); Chong-You Lee, Hsinchu (TW); Wei Jen Chen, Hsinchu (TW); Maoching Chiu, Hsinchu (TW); Timothy Perrin Fisher-Jeffes, San Jose, CA (US); Ju-Ya Chen, Hsinchu (TW); Yen Shuo Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/971,350

(22) Filed: May 4, 2018

(65) Prior Publication Data

US 2018/0323801 A1 Nov. 8, 2018

Related U.S. Application Data

(60) Provisional application No. 62/501,953, filed on May 5, 2017, provisional application No. 62/517,219, filed (Continued)

(51) Int. Cl.
*H03M 13/11* (2006.01)
*H04L 1/00* (2006.01)
*H03M 13/00* (2006.01)

(52) U.S. Cl.
CPC ...... *H03M 13/1162* (2013.01); *H03M 13/116* (2013.01); *H03M 13/6516* (2013.01); *H04L 1/0057* (2013.01); *H04L 1/0071* (2013.01)

(58) Field of Classification Search
CPC ...... H03M 13/00; H03M 13/09; H03M 13/11; H03M 13/13; H03M 13/116;
(Continued)

(56) References Cited

U.S. PATENT DOCUMENTS 9,306,602 B2 * 4/2016 Murakami ......... H03M 13/1154
10,164,659 B2 * 12/2018 Chiu ..................... H04L 1/1819
(Continued)

OTHER PUBLICATIONS

International Search Report of PCT/CN2018/085648, dated Jul. 25, 2018.

(Continued)

*Primary Examiner* — Tri H Phan
(74) *Attorney, Agent, or Firm* — Locke Lord LLP; Tim Tingkang Xia, Esq.

(57) ABSTRACT

An apparatus determines a code block size (CBS) of information bits contained in a codeword of low-density parity check (LDPC) coding. The apparatus compares the CBS with at least one threshold, determines, based on a result of the comparison, a Kb number and determines a Kp number based on a code rate and the Kb number. The apparatus generates a parity check matrix. An information portion of the parity check matrix is a first matrix formed by M number of second square matrices. M is equal to Kp multiplied by Kb. A total number of columns in the Kb number of second square matrices is equal to a total number of bits of the CBS. One or more matrices of the M number of second square matrices are circular permutation matrices. The apparatus operates an LDPC encoder or an LDPC decoder based on the parity check matrix.

20 Claims, 11 Drawing Sheets

Related U.S. Application Data on Jun. 9, 2017, provisional application No. 62/525,243, filed on Jun. 27, 2017, provisional application No. 62/525,797, filed on Jun. 28, 2017.

(58) Field of Classification Search

CPC ............. H03M 13/118; H03M 13/255; H03M 13/616; H03M 13/635; H03M 13/1102; H03M 13/1148; H03M 13/1151; H03M 13/1154; H03M 13/1157; H03M 13/1162; H03M 13/1165; H03M 13/1168; H03M 13/1171; H03M 13/1174; H03M 13/1177; H03M 13/1182; H03M 13/1185; H03M 13/1188; H03M 13/2906; H03M 13/6356; H03M 13/6362; H03M 13/6368; H03M 13/6375; H03M 13/6381; H03M 13/6387; H03M 13/6393; H03M 13/6513; H03M 13/6516; H04L 1/00; H04L 1/0013; H04L 1/0041; H04L 1/0045; H04L 1/0057; H04L 1/0061; H04L 1/0068; H04L 1/0071; H04L 1/0076; H04L 1/18

See application file for complete search history.

(56) References Cited

U.S. PATENT DOCUMENTS 10,425,189 B2 * 9/2019 Kim ..................... H03M 13/116
10,484,132 B2 * 11/2019 Byun ................ H03M 13/6306
2017/0187489 A1 * 6/2017 Myung .............. H03M 13/1102
2018/0034585 A1 * 2/2018 Kim ....................... H04L 1/0057
2018/0205497 A1 * 7/2018 Wang .................... H03M 13/05
2018/0278370 A1 * 9/2018 Jeong .................... H04L 1/0058
2018/0323801 A1 * 11/2018 Hsu .................... H03M 13/1162
2018/0331784 A1 * 11/2018 Chiu ..................... H04L 1/0058
2019/0068224 A1 * 2/2019 Li ......................... H03M 13/00
2019/0109672 A1 * 4/2019 Kim ...................... H04L 1/0041

OTHER PUBLICATIONS

3GPP TSG RAN WG1 Meeting #85m, R1-164183, Nanjing, China, Agenda item: 7.1.5.1, Source: Intel Corporation, Title: LDPC code design for NR, Document for: Discussion, 2016.
3GPP TSG RAN WG1 #86, R1-166414, Gothenburg, Sweden, Source: ZTE Corp., ZTE Microelectronics, Title: Discussion on LDPC codes for NR, Agenda item: 8.1.4.1, Document for: Discussion/Decision, 2016.
3GPP TSG RAN WG1 #86bis, R1-1608974, Lisbon, Portugal, Source: ZTE, ZTE Microelectronics, Title: Consideration on LDPC design for NR, Agenda item: 8.1.3.1, Document for: Discussion/Decision, 2016.
3GPP TSG RAN WG1 AH NR Meeting, R1-1701473, Spokane, USA, Agenda Item: 5.1.5.1, Source: ZTE, ZTE Microelectronics, Title: Compact LDPC design for eMBB, Document for: Discussion and Decision, 2017.
Taiwan Patent Office, "Office Action", dated Dec. 13, 2019, Taiwan.
3GPP TSG RAN WG1 AH_NR Meeting, R1-1701473, Spokane, USA, Jan. 16-20, 2017.

* cited by examiner 200
10 ms
slot
RB
subframe
subcarrier
OFDM symbol
slot 0
slot 1
CRS
UE-RS
CSI-RS 230
PCFICH
PDCCH
PHICH
SSCH
PSCH
PDSCH
PBCH
ePDCCH
DL system bandwidth RBs 250
SC-FDMA symbol
SRS 280
PUCCH
PUSCH
PRACH
DM-RS
SRS Comb 0
SRS Comb 1
UL system bandwidth RBs

QC-LDPC CODES

CROSS-REFERENCE TO RELATED APPLICATION(S)

This application claims the benefit of U.S. Provisional Applications Ser. Nos. 62/501,953, 62/517,219, 62/525,243 and 62/525,797 entitled "QC-LDPC CODES" and filed on May 5, 2017, Jun. 9, 2017, Jun. 27, 2017 and Jun. 28, 2017, respectively, which are expressly incorporated by reference herein in their entirety.

BACKGROUND

Field

The present disclosure relates generally to mobile communication systems, and more particularly, to methods and apparatus of quasi-cyclic-low-density parity-check (QC-LDPC) coding.

Background

The statements in this section merely provide background information related to the present disclosure and may not constitute prior art.

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. The 3GPP has also agreed that QC-LDPC will be used for in 5G NR data channel. There exists a need for further improvements in QC-LDPC coding.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a UE or a base station. The apparatus determines a code block size (CBS) of information bits contained in a codeword of low-density parity check (LDPC) coding. The apparatus also compares the CBS with at least one threshold and determines, based on a result of the comparison, a Kb number. Additionally, the apparatus determines a Kp number based on a code rate and the Kb number. The apparatus further generates a parity check matrix of the LDPC coding. An information portion of the parity check matrix is a first matrix formed by M number of second square matrices. M is equal to Kp multiplied by Kb. A total number of columns in the Kb number of second square matrices is equal to a total number of bits of the CBS. One or more matrices of the M number of second square matrices are circular permutation matrices. The apparatus operates an LDPC encoder or an LDPC decoder based on the parity check matrix.

In another aspect, an apparatus for a wireless communication includes a processor and a memory device coupled to the processor. The memory device contains a set of instructions that, when executed by the processor, cause the processor to determine a code block size (CBS) of information bits contained in a codeword of low-density parity check (LDPC) coding. The set of instructions further cause the processor to compare the CBS with at least one threshold and determine, based on a result of the comparison, a Kb number. Additionally, the set of instructions cause the processor to determine a Kp number based on a code rate and the Kb number. The set of instructions also cause the processor to generate a parity check matrix of the LDPC coding. An information portion of the parity check matrix is a first matrix formed by M number of second square matrices. M is equal to Kp multiplied by Kb. A total number of columns in the Kb number of second square matrices is equal to a total number of bits of the CBS. One or more matrices of the M number of second square matrices are circular permutation matrices. Lastly, the set of instructions cause the processor to operate an LDPC encoder or an LDPC decoder based on the parity check matrix.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
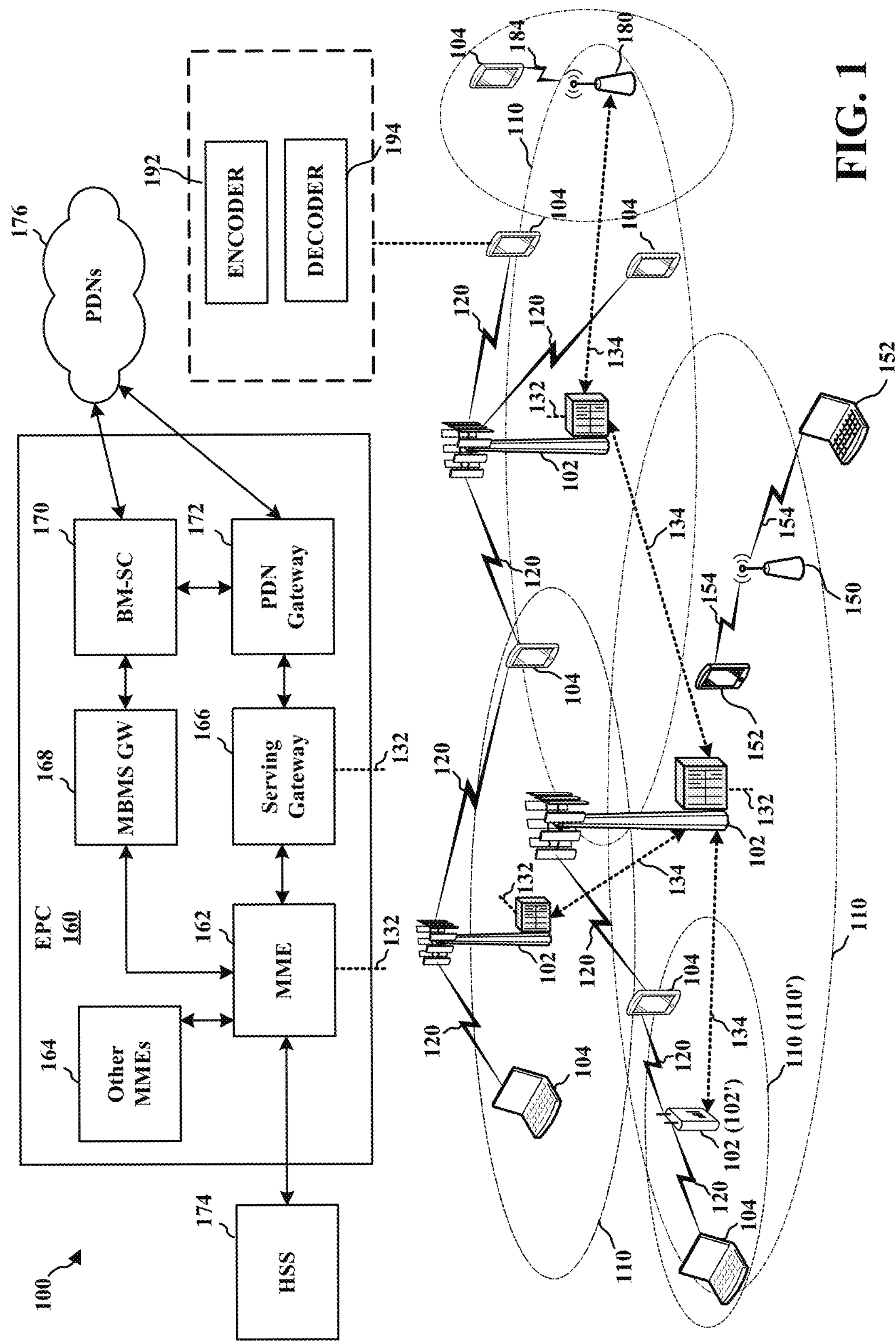
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile

Telecommunications System (UMTS) Terrestrial Radio Access Network (E-UTRAN)) interface with the EPC 160 through backhaul links 132 (e.g., 51 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Figures 2A, 2B, 2C, 2D:
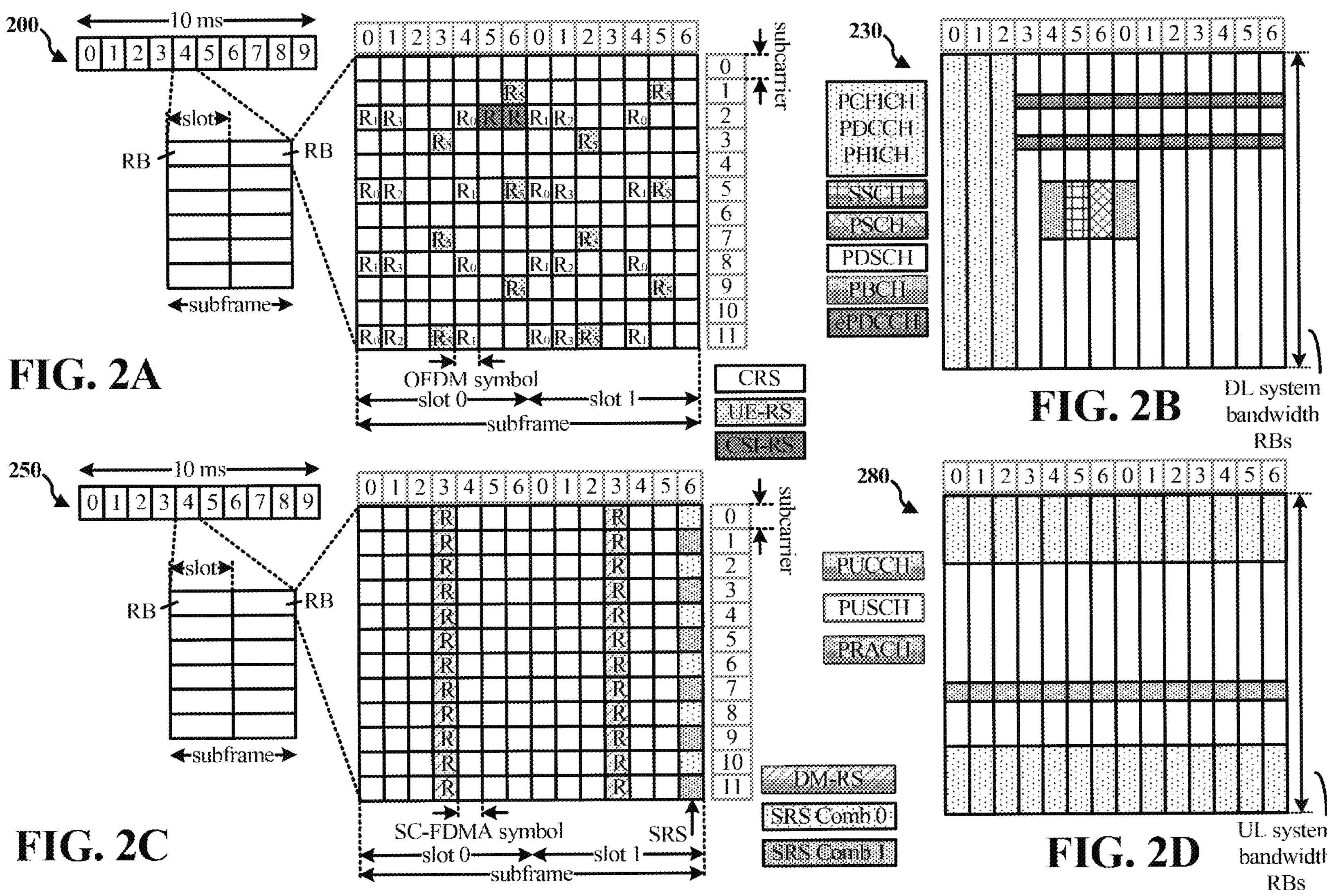
FIGS. 2A, 2B, 2C, and 2D are diagrams illustrating examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as R0, R1, R2, and R3, respectively), UE-RS for antenna port 5 (indicated as R5), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame.

The PSCH carries a primary synchronization signal (PSS) that is used by a UE to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
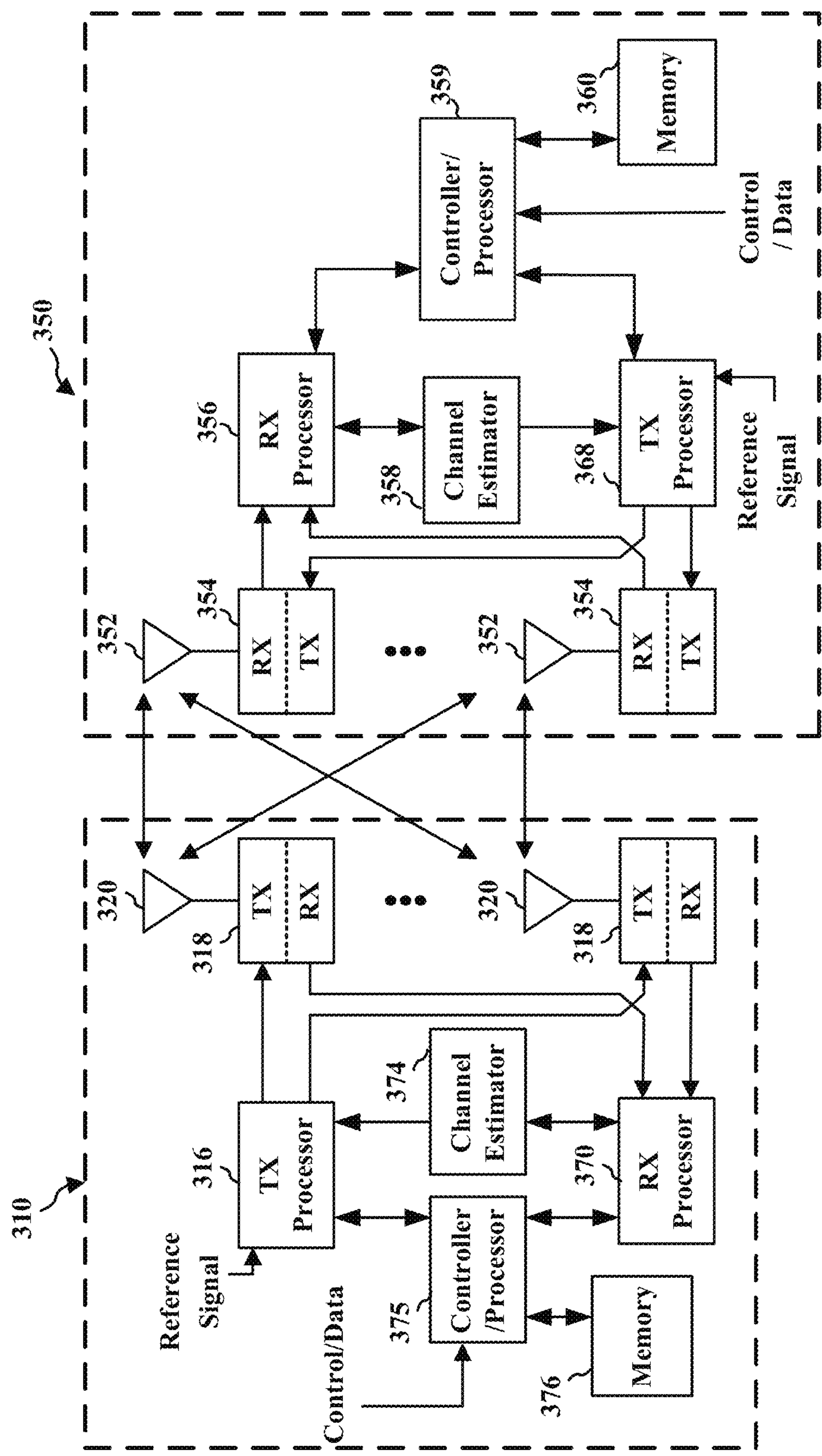
FIG. 3 is a diagram illustrating a base station in communication with a UE in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission. The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). NR may utilize OFDM with a cyclic prefix (CP) on the uplink and downlink and may include support for half-duplex operation using time division duplexing (TDD). NR may include Enhanced Mobile Broadband (eMBB) service targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC) service.

A single component carrier bandwidth of 100 MHZ may be supported. In one example, NR resource blocks (RBs) may span 12 sub-carriers with a sub-carrier bandwidth of 75 kHz over a 0.1 ms duration or a bandwidth of 15 kHz over a 1 ms duration. Each radio frame may consist of 10 or 50 subframes with a length of 10 ms. Each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface.

The NR RAN may include a central unit (CU) and distributed units (DUs). A NR BS (e.g., gNB, 5G Node B, Node B, transmission reception point (TRP), access point (AP)) may correspond to one or multiple BSs. NR cells can be configured as access cells (ACells) or data only cells (DCells). For example, the RAN (e.g., a central unit or distributed unit) can configure the cells. DCells may be cells used for carrier aggregation or dual connectivity and may not be used for initial access, cell selection/reselection, or handover. In some cases DCells may not transmit synchronization signals (SS) in some cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 4:
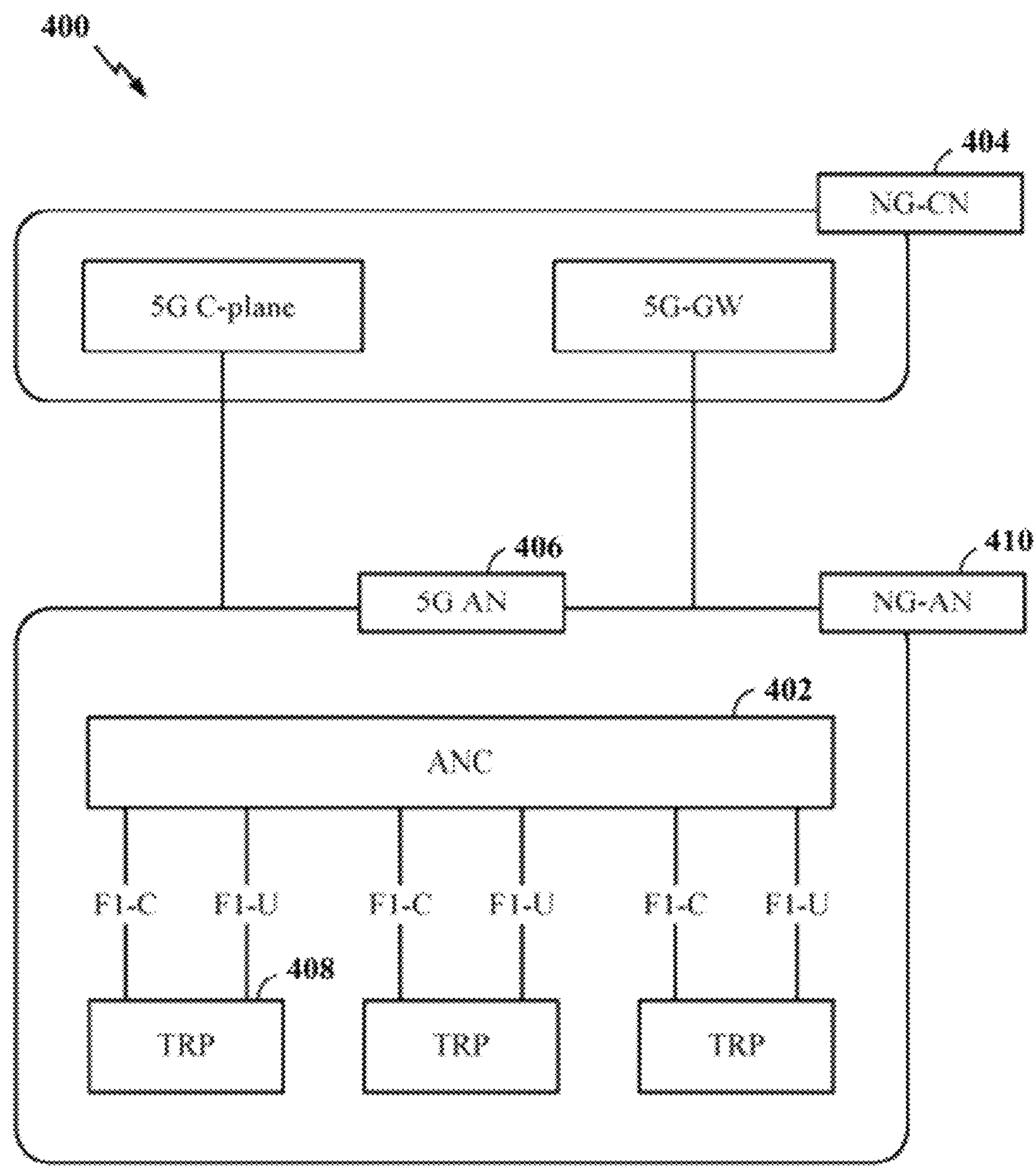
FIG. 4 illustrates an example logical architecture of a distributed access network.

FIG. 4 illustrates an example logical architecture 400 of a distributed RAN, according to aspects of the present disclosure. A 5G access node 406 may include an access node controller (ANC) 402. The ANC may be a central unit (CU) of the distributed RAN 400. The backhaul interface to the next generation core network (NG-CN) 404 may terminate at the ANC. The backhaul interface to neighboring next generation access nodes (NG-ANs) may terminate at the ANC. The ANC may include one or more TRPs 408 (which may also be referred to as BSs, NR BSs, Node Bs, 5G NBs, APs, or some other term). As described above, a TRP may be used interchangeably with "cell."

The TRPs 408 may be a distributed unit (DU). The TRPs may be connected to one ANC (ANC 402) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture of the distributed RAN 400 may be used to illustrate fronthaul definition. The architecture may be defined that support fronthauling solutions across different deployment types. For example, the architecture may be based on transmit network capabilities (e.g., bandwidth, latency, and/or jitter). The architecture may share features and/or components with LTE. According to aspects, the next generation AN (NG-AN) 410 may support dual connectivity with NR. The NG-AN may share a common fronthaul for LTE and NR.

The architecture may enable cooperation between and among TRPs 408. For example, cooperation may be preset within a TRP and/or across TRPs via the ANC 402. According to aspects, no inter-TRP interface may be needed/present.

According to aspects, a dynamic configuration of split logical functions may be present within the architecture of the distributed RAN 400. The PDCP, RLC, MAC protocol may be adaptably placed at the ANC or TRP.

Figure 5:
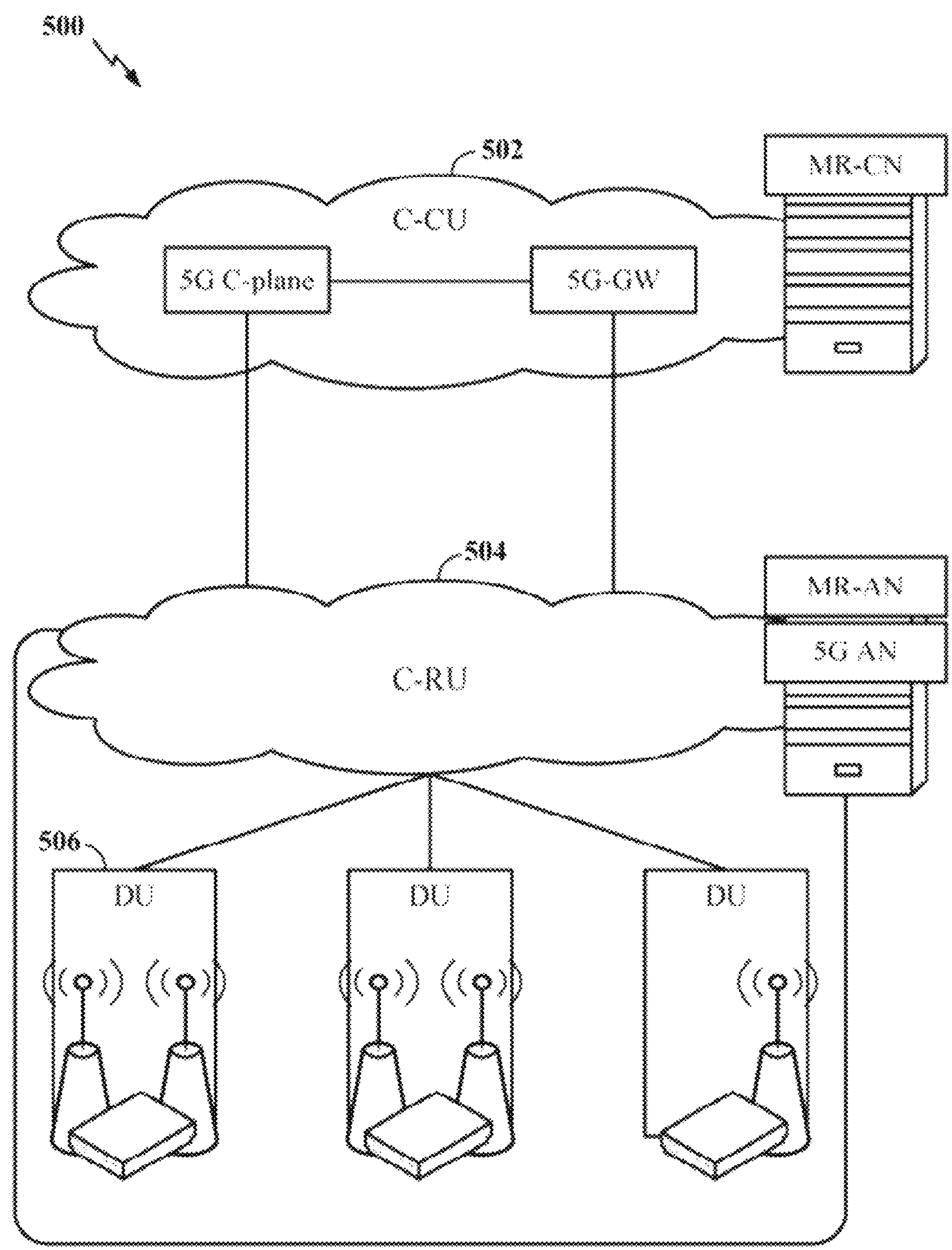
FIG. 5 illustrates an example physical architecture of a distributed access network.

FIG. 5 illustrates an example physical architecture of a distributed RAN 500, according to aspects of the present disclosure. A centralized core network unit (C-CU) 502 may host core network functions. The C-CU may be centrally deployed. C-CU functionality may be offloaded (e.g., to advanced wireless services (AWS)), in an effort to handle peak capacity. A centralized RAN unit (C-RU) 504 may host one or more ANC functions. Optionally, the C-RU may host core network functions locally. The C-RU may have distributed deployment. The C-RU may be closer to the network edge. A distributed unit (DU) 506 may host one or more TRPs. The DU may be located at edges of the network with radio frequency (RF) functionality.

Figure 6:
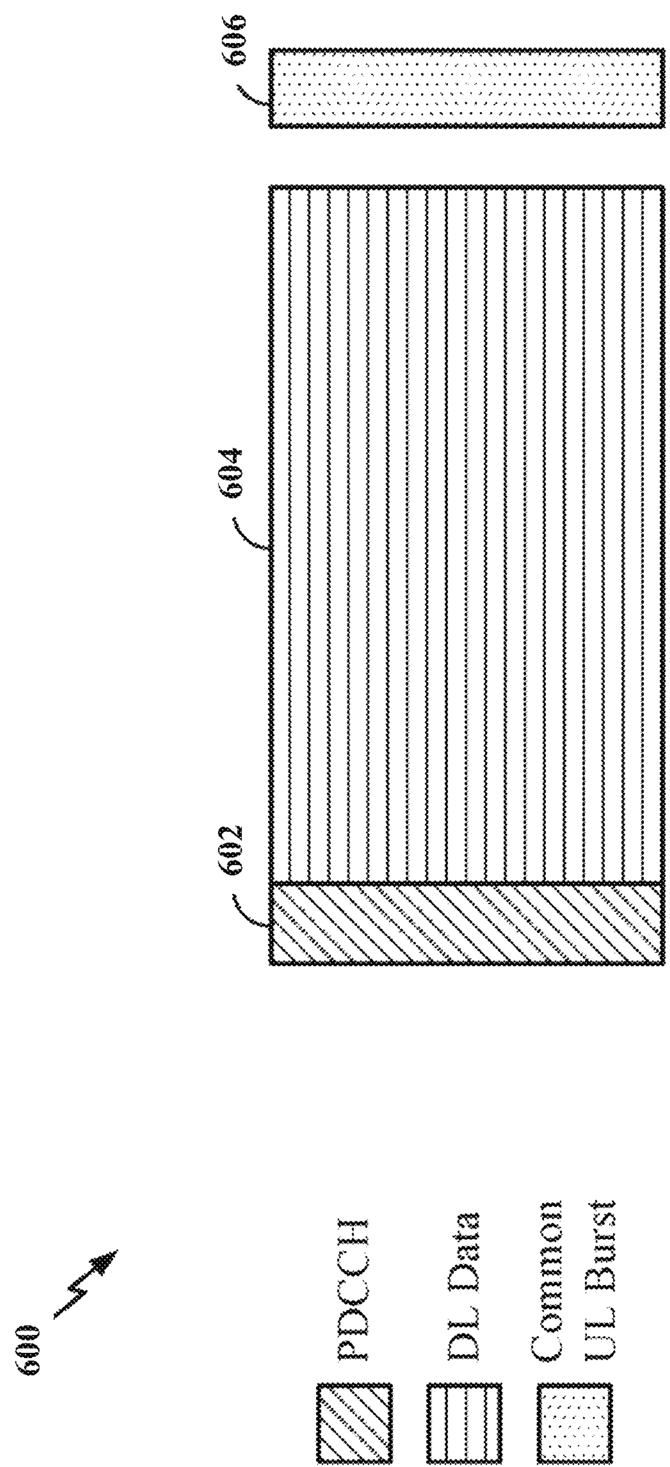
FIG. 6 is a diagram showing an example of a DL-centric subframe.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information.

As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
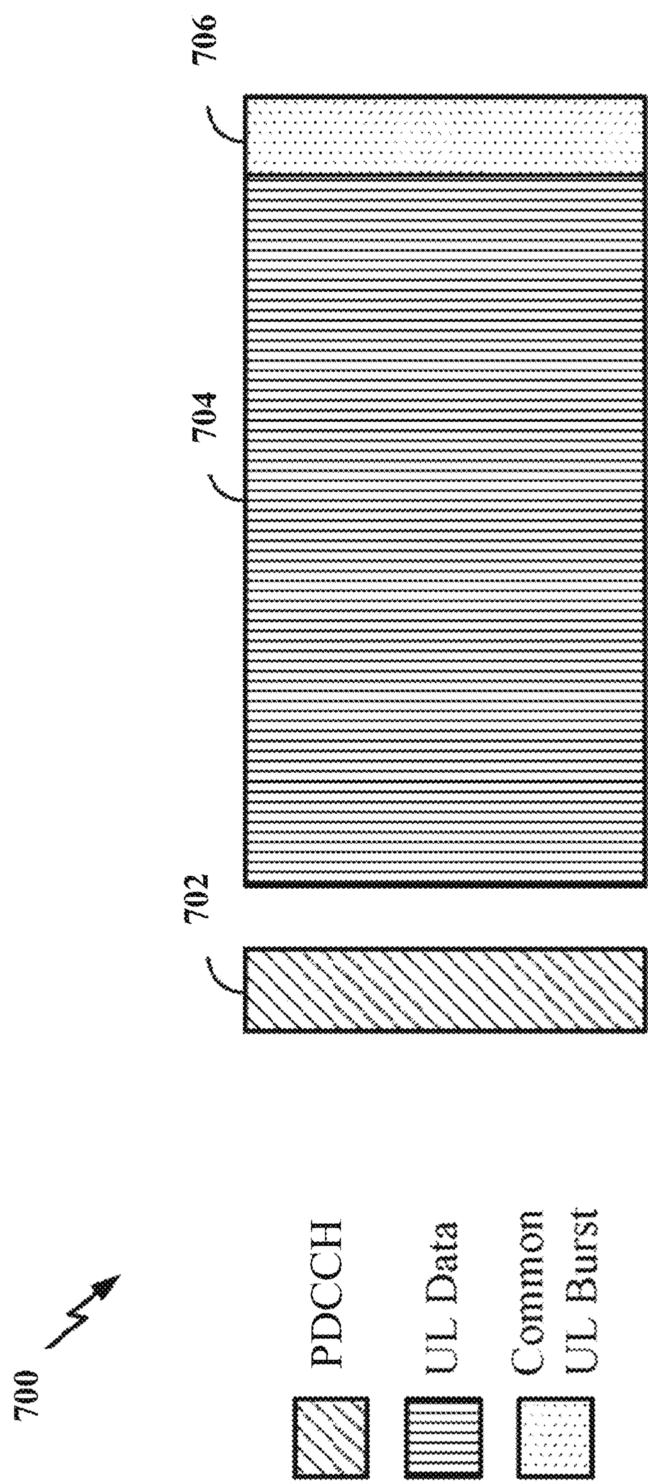
FIG. 7 is a diagram showing an example of an UL-centric subframe.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion 602 described above with reference to FIG. 6. The UL-centric subframe may also include an UL data portion 704. The UL data portion 704 may sometimes be referred to as the pay load of the UL-centric subframe. The UL portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additionally or alternatively include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

Embodiments are disclosed below for using LDPC codes in cellular and other communication systems. LDPC codes are linear block codes, which may be constructed using a sparse bipartite graph.

LDPC codes are defined by a sparse parity-check matrix. Consider a (N, K) LDPC code, where K is the information block length and N is coded block length. Its parity check matrix is of size (N−K)*N, whose majority elements are 0. As a linear block code, the encoding of an LDPC code is based on its generator matrix. The decoding of LDPC codes is based on a belief propagation algorithm or a sum-product decoding.

The design of a good LDPC code relies on the design of its parity check matrix. One type of LDPC code constructed in a deterministic and systematic way is called a quasi-cyclic LDPC code (QC-LDPC). See IEEE Std 802.1 1-2012, “Wireless LAN Medium Access Control (MAC) and Physical Layer (PHY) specifications” for a standardized implementation of QC-LDPC codes A QC-LDPC code may be uniquely defined by its base graph B.

LDPC codes are adopted in several standards and used in many communication systems, for example, the DVB-S2 standard for satellite transmission of digital television, ITU-T G.hn standard, 10GBase-T Ethernet system, and the Wi-Fi 802.11 standard. In 5G, there are a few use cases which make LDPC codes of particular use. For example, there is a use case for enhanced massive mobile broadband (eMBB) communications.

Generally, a QC-LDPC matrix can be described by its equivalent bipartite graph ("Tanner graph"), wherein each edge of the Tanner graph connects one variable node of a plurality of variable nodes (which form the first set of the bipartite graph) to one check node of a plurality of check nodes (which form the second set of the bipartite graph). A well-known construction of LDPC codes is based on protographs, also referred to as base graphs or projected graphs. In such constructions, a bipartite base graph G is copied N times and for each edge e of G, a permutation is applied to the N copies of e to interconnect the N copies of G. The resulting graph, called the N-cover or the N-lifting of G, is then used as the Tanner graph of the LDPC code. If the permutations are cyclic, the resulting LDPC code is called quasi-cyclic (QC).

QC LDPC codes are attractive due to their relatively simple implementation and analysis. For example, a QC-LDPC matrix of r rows and n columns can be represented by its equivalent bipartite graph with r check nodes and n variable nodes which has edges between the check nodes and the variable nodes if there are corresponding "1s" in the QC-LDPC matrix (cf. R. Tanner, "A Recursive Approach to Low Complexity Codes", IEEE TRANSACTIONS IN INFORMATION THEORY, Volume 27, Issue 5, Pages 533-547, September 1981). Thus, the variable nodes represent code-word bits and the check nodes represent parity-check equations.

In certain configurations, different types of base graphs could be used for QC LDPC codes depending on size of selected information blocks and code rates (CRs), for example. The CR is defined as the number of information bits divided by the number of coded bits.

Figure 8:
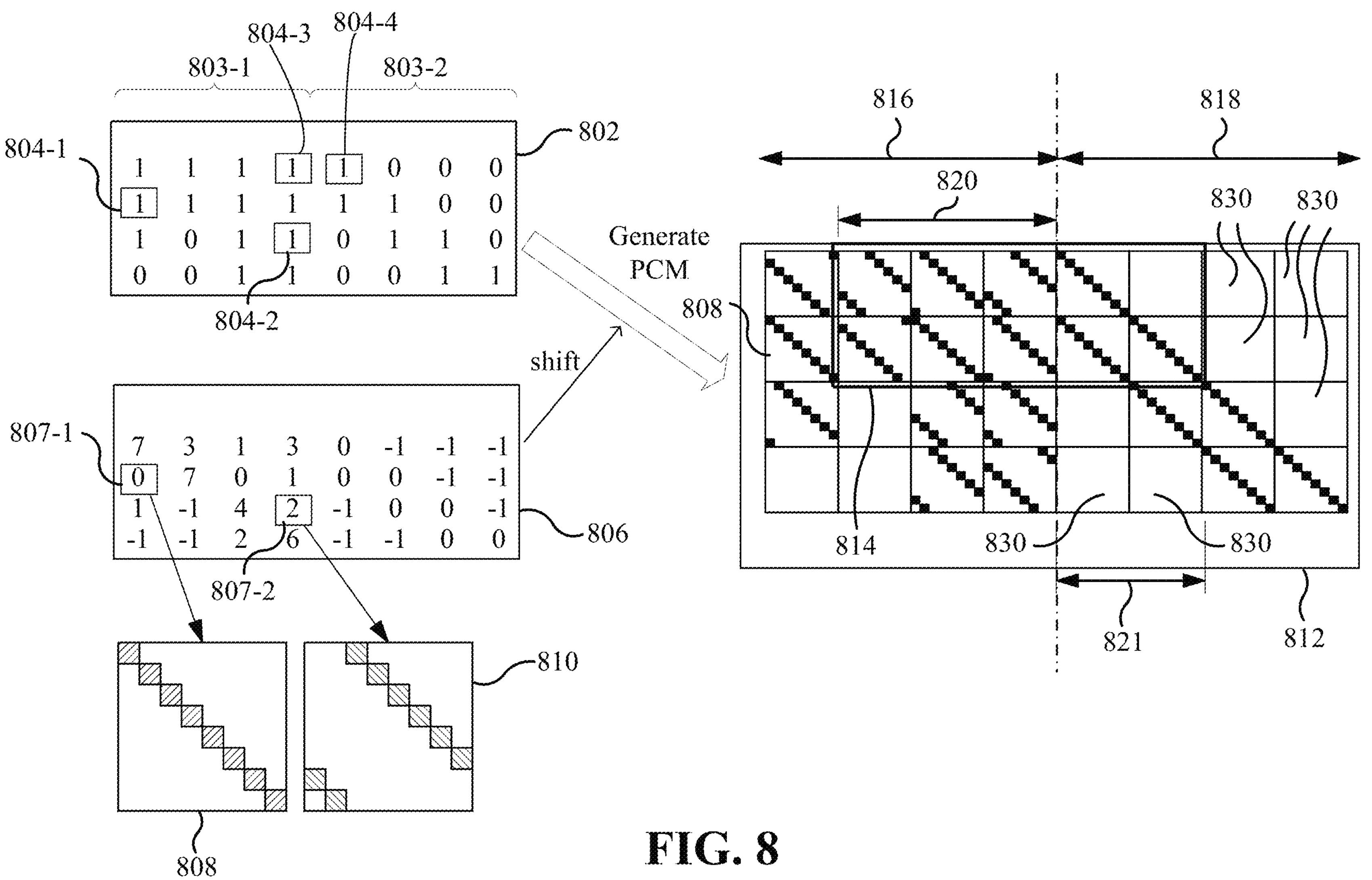
FIG. 8 is a diagram of an example multi-embedded LDPC code design.

FIG. 8 is a diagram illustrating a technique utilized by a base station (e.g., the base station 102) or a UE (e.g., the UE 104) to generate a parity check matrix (PCM). An exemplary base graph 802 defines a basic structure of the parity check matrix to be generated by the base station or the UE. In this example, the base graph 802 has 8 columns. Further, in the example, the base graph 802 has an information region 803-1 and a parity region 803-2. In this example, the information region 803-1 contains the first four columns and the parity region 803-2 contains the rest of the columns. In this technique, the base station and/or the UE, when generating the PCM, select a region of the base graph 802, and then replaces every "1" in the selected region with a circular permutation matrix (CPM) of size Z×Z (e.g., 8×8) and every "0" in the selected region with a Z×Z matrix of all zeros (e.g., elements 830), Z being a lifting factor. Each CPM is an identity matrix with rows cyclically shifted by an amount as described below. FIG. 8 shows exemplary CPMs 808, 810.

The rows of a parity check matrix 812, generated as described below, are the coefficients of the parity check equations. That is, they show how linear combinations of certain digits (components) of each codeword equal zero. For example, the parity check matrix $$H = \begin{bmatrix} 0011 \\ 1100 \end{bmatrix}$$

compactly represents the parity check equations, $$c_3+c_4=0$$

$$c_1+c_2=0$$

that must be satisfied for $c_1$ $c_2$ $c_3$ $c_4$ to be a codeword.

More specifically, to generate the PCM, the UE or base station initially replaces "1"s in the base graph 802 with an identify matrix of size Z. Further, the UE or base station cyclically shifts elements of the identity matrix based on a corresponding shift coefficients table 806. A particular positive number in the shift coefficients table 806 indicates the corresponding identity matrix in the base graph 802 should be shifted to the right the particular number of times. A particular negative number in the shift coefficients table 806 indicates the corresponding identity matrix in the base graph 802 should be shifted to the left the particular number of times. For example, a shift coefficient 807-1 in the shift coefficients table 806 corresponds to an element 804-1 in the base graph 802. The number "0" of the shift coefficient 807-1 indicates that the identity matrix is not shifted. Accordingly, the element 804-1 is replaced by the CPM 808 in the generated parity check matrix 812. A shift coefficient 807-2 in the shift coefficients table 806 corresponds to an element 804-2 in the base graph 802. The number "2" of the shift coefficient 807-2 indicates that the identity matrix is shifted to the right twice. Accordingly, the element 804-1 is replaced by the CPM 810 in the generated parity check matrix 812.

The parity check matrix 812 has two portions. A first portion 816 (corresponding to the information region 803-1 of the base graph 802) represents information columns portion and a second portion 818 (corresponding to the parity region 803-2 of the base graph 802) represents a parity columns portion. Using a technique described below, the UE or base station can determine a Kb number. Based on the Kb number, the UE or base station use the entire or only a selected portion 814 of the base graph 802 to generate the parity check matrix 812. The selected portion 814 is formed by two parts with one part including a subset of the information columns of the parity check matrix 812 and a second part including a subset of parity columns of the parity check matrix 812. In the illustrated example, the first portion 816 of the parity check matrix 812 has a 4×4 size of the information columns and the second portion 818 has the same size 4×4 of parity columns. However, the submatrix 814 uses only Kb number (e.g., 3) information bits columns 820 and Kp number (e.g., 2) parity columns 821. The Kp number is determined based on the Kb number and the code rate. For example, if Kb number is 3 and code rate is 2/3 then Kp number is 3*2/3 (i.e., 2). The parity part is a square matrix having a size of Kp by Kp. In this example, two parts of the sub-matrix 814 have sizes 3×2 and 2×2 corresponding to information part and parity part, respectively. In particular, the UE or base station selects a submatrix that has a size of Kp by Kb and that includes the last information element 804-3 on the first row from the information region 803-1 of the base graph 802 to form the first portion 816 of the parity check matrix 812. The UE or base station selects a square submatrix that has a size of Kp by Kp and that includes the first parity element 804-4 on the first row from the parity region 803-2 of the base graph 802 to form the second portion 818 of the parity check matrix 812. Kp is a number that can be determined based on the number Kb and an adopted code rate.

A code block size (CBS) of a LDPC code indicates the number of information bits in the LDPC code. Thus, CBS equals to the number of columns in the information region of the submatrix 814. As discussed above, each row of the information region of the submatrix 814 contains Kb number of CPMs. Each CPM is a Z by Z matrix. Therefore, CBS can be represented by the following equation (1):

$$CBS=Kb*Z \quad (1).$$

FIG. 8 shows that the information region of the submatrix 814 has Kb number (e.g., 3) information bits columns 820.

Z is also referred to as a lifting factor. In general, LDPC code performance is better if Kb or Z is larger. Larger Kb provides a higher information column freedom, which may lead to a better performance. Larger Z provides a higher shift coefficients matrix freedom, which may lead to a better performance.

There is a trade-off between the number Kb and the lifting factor Z selection. The effect of increased size of information bits columns (Kb) and/or higher lifting factor Z is highly non-linear. Benefits of the Kb size and lifting factor Z saturate differently. Whether Kb or Z dictates the performance in general depends on CBS. Accordingly, selections of these factors can be rebalanced to improve performance of QC LDPC codes. QC LDPC codes performance is typically better for larger CBS since it provides higher flexibility to both information columns size Kb and lifting factor Z. Larger CBS provides the benefit of high degree of randomness with respect to inter-node information passing.

As noted above, for initial transmission of a transport block with a particular code rate and for subsequent re-transmission of the same transport block, each code block of the transport block is encoded with either LDPC base graph 1 or base graph 2 according to certain rules. Typically, the LDPC base graph 1 covers 8/9~2/3 CR and small to larger block sizes, while the LDPC base graph 2 covers 2/3~1/5 CR and very small to medium block sizes. LDPC base graph 1 is a matrix having 46 rows with row indices i=0, 1, 2, . . . , 45 and 68 columns with column indices j=0, 1, 2, . . . , 67. LDPC base graph 2 is a matrix having 42 rows with row indices i=0, 1, 2, . . . , 41 and 52 columns with column indices j=0, 1, 2, . . . , 51. The elements with row and column indices given in Table 1 (for LDPC base graph 1) and Table 2 (for LDPC base graph 2) are of value 1, and all other elements are of value 0.

TABLE 1

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 0 | 0 | 250 | 307 | 73 | 223 | 211 | 294 | 0 | 135 |
| | 1 | 69 | 19 | 15 | 16 | 198 | 118 | 0 | 227 |
| | 2 | 226 | 50 | 103 | 94 | 188 | 167 | 0 | 126 |
| | 3 | 159 | 369 | 49 | 91 | 186 | 330 | 0 | 134 |
| | 5 | 100 | 181 | 240 | 74 | 219 | 207 | 0 | 84 |
| | 6 | 10 | 216 | 39 | 10 | 4 | 165 | 0 | 83 |
| | 9 | 59 | 317 | 15 | 0 | 29 | 243 | 0 | 53 |
| | 10 | 229 | 288 | 162 | 205 | 144 | 250 | 0 | 225 |
| | 11 | 110 | 109 | 215 | 216 | 116 | 1 | 0 | 205 |
| | 12 | 191 | 17 | 164 | 21 | 216 | 339 | 0 | 128 |
| | 13 | 9 | 357 | 133 | 215 | 115 | 201 | 0 | 75 |
| | 15 | 195 | 215 | 298 | 14 | 233 | 53 | 0 | 135 |

TABLE 1-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 104 | 73 | 47 | 0 | 105 |
| | 21 | 31 | 346 | 32 | 81 | 261 | 188 | 0 | 137 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 2 | 76 | 303 | 141 | 179 | 77 | 22 | 96 |
| | 2 | 239 | 76 | 294 | 45 | 162 | 225 | 11 | 236 |
| | 3 | 117 | 73 | 27 | 151 | 223 | 96 | 124 | 136 |
| | 4 | 124 | 288 | 261 | 46 | 256 | 338 | 0 | 221 |
| | 5 | 71 | 144 | 161 | 119 | 160 | 268 | 10 | 128 |
| | 7 | 222 | 331 | 133 | 157 | 76 | 112 | 0 | 92 |
| | 8 | 104 | 331 | 4 | 133 | 202 | 302 | 0 | 172 |
| | 9 | 173 | 178 | 80 | 87 | 117 | 50 | 2 | 56 |
| | 11 | 220 | 295 | 129 | 206 | 109 | 167 | 16 | 11 |
| | 12 | 102 | 342 | 300 | 93 | 15 | 253 | 60 | 189 |
| | 14 | 109 | 217 | 76 | 79 | 72 | 334 | 0 | 95 |
| | 15 | 132 | 99 | 266 | 9 | 152 | 242 | 6 | 85 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 260 | 31 | 156 | 9 | 168 | 163 |
| | 21 | 28 | 112 | 301 | 187 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 106 | 205 | 68 | 207 | 258 | 226 | 132 | 189 |
| | 1 | 111 | 250 | 7 | 203 | 167 | 35 | 37 | 4 |
| | 2 | 185 | 328 | 80 | 31 | 220 | 213 | 21 | 225 |
| | 4 | 63 | 332 | 280 | 176 | 133 | 302 | 180 | 151 |
| | 5 | 117 | 256 | 38 | 180 | 243 | 111 | 4 | 236 |
| | 6 | 93 | 161 | 227 | 186 | 202 | 265 | 149 | 117 |
| | 7 | 229 | 267 | 202 | 95 | 218 | 128 | 48 | 179 |
| | 8 | 177 | 160 | 200 | 153 | 63 | 237 | 38 | 92 |
| | 9 | 95 | 63 | 71 | 177 | 0 | 294 | 122 | 24 |
| | 10 | 39 | 129 | 106 | 70 | 3 | 127 | 195 | 68 |
| | 13 | 142 | 200 | 295 | 77 | 74 | 110 | 155 | 6 |
| | 14 | 225 | 88 | 283 | 214 | 229 | 286 | 28 | 101 |
| | 15 | 225 | 53 | 301 | 77 | 0 | 125 | 85 | 33 |
| | 17 | 245 | 131 | 184 | 198 | 216 | 131 | 47 | 96 |
| | 18 | 205 | 240 | 246 | 117 | 269 | 163 | 179 | 125 |
| | 19 | 251 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 201 | 187 | 97 | 4 | 128 |
| | 1 | 89 | 87 | 208 | 18 | 145 | 94 | 6 | 23 |
| | 3 | 84 | 0 | 30 | 165 | 166 | 49 | 33 | 162 |
| | 4 | 20 | 275 | 197 | 5 | 108 | 279 | 113 | 220 |
| | 6 | 150 | 199 | 61 | 45 | 82 | 139 | 49 | 43 |
| | 7 | 131 | 153 | 175 | 142 | 132 | 166 | 21 | 186 |
| | 8 | 243 | 56 | 79 | 16 | 197 | 91 | 6 | 96 |
| | 10 | 136 | 132 | 281 | 34 | 41 | 106 | 151 | 1 |
| | 11 | 86 | 305 | 303 | 155 | 162 | 246 | 83 | 216 |
| | 12 | 246 | 231 | 253 | 213 | 57 | 345 | 154 | 22 |
| | 13 | 219 | 341 | 164 | 147 | 36 | 269 | 87 | 24 |
| | 14 | 211 | 212 | 53 | 69 | 115 | 185 | 5 | 167 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 157 | 332 | 233 | 170 | 246 | 42 | 24 | 64 |
| | 1 | 102 | 181 | 205 | 10 | 235 | 256 | 204 | 211 |
| | 26 | 0 | 0 | 0 | 0 | 0 | 0 | 0 | 0 |
| 5 | 0 | 205 | 195 | 83 | 164 | 261 | 219 | 185 | 2 |
| | 1 | 236 | 14 | 292 | 59 | 181 | 130 | 100 | 171 |
| | 3 | 194 | 115 | 50 | 86 | 72 | 251 | 24 | 47 |
| | 12 | 231 | 166 | 318 | 80 | 283 | 322 | 65 | 143 |
| | 16 | 28 | 241 | 201 | 182 | 254 | 295 | 207 | 210 |
| | 21 | 123 | 51 | 267 | 130 | 79 | 258 | 161 | 180 |

TABLE 1-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| | 22 | 115 | 157 | 279 | 153 | 144 | 283 | 72 | 180 |
| | 27 | 0 | 0 | 0 | 0 | 0 | 0 | 0 | 0 |
| 6 | 0 | 183 | 278 | 289 | 158 | 80 | 294 | 6 | 199 |
| | 6 | 22 | 257 | 21 | 119 | 144 | 73 | 27 | 22 |
| | 10 | 28 | 1 | 293 | 113 | 169 | 330 | 163 | 23 |
| | 11 | 67 | 351 | 13 | 21 | 90 | 99 | 50 | 100 |
| | 13 | 244 | 92 | 232 | 63 | 59 | 172 | 48 | 92 |
| | 17 | 11 | 253 | 302 | 51 | 177 | 150 | 24 | 207 |
| | 18 | 157 | 18 | 138 | 136 | 151 | 284 | 38 | 52 |
| | 20 | 211 | 225 | 235 | 116 | 108 | 305 | 91 | 13 |
| | 28 | 0 | 0 | 0 | 0 | 0 | 0 | 0 | 0 |
| 7 | 0 | 220 | 9 | 12 | 17 | 169 | 3 | 145 | 77 |
| | 1 | 44 | 62 | 88 | 76 | 189 | 103 | 88 | 146 |
| | 4 | 159 | 316 | 207 | 104 | 154 | 224 | 112 | 209 |
| | 7 | 31 | 333 | 50 | 100 | 184 | 297 | 153 | 32 |
| | 8 | 167 | 290 | 25 | 150 | 104 | 215 | 159 | 166 |
| | 14 | 104 | 114 | 76 | 158 | 164 | 39 | 76 | 18 |
| | 29 | 0 | 0 | 0 | 0 | 0 | 0 | 0 | 0 |
| 8 | 0 | 112 | 307 | 295 | 33 | 54 | 348 | 172 | 181 |
| | 1 | 4 | 179 | 133 | 95 | 0 | 75 | 2 | 105 |
| | 3 | 7 | 165 | 130 | 4 | 252 | 22 | 131 | 141 |
| | 12 | 211 | 18 | 231 | 217 | 41 | 312 | 141 | 223 |
| | 16 | 102 | 39 | 296 | 204 | 98 | 224 | 96 | 177 |
| | 19 | 164 | 224 | 110 | 39 | 46 | 17 | 99 | 145 |
| | 21 | 109 | 368 | 269 | 58 | 15 | 59 | 101 | 199 |
| | 22 | 241 | 67 | 245 | 44 | 230 | 314 | 35 | 153 |
| | 24 | 90 | 170 | 154 | 201 | 54 | 244 | 116 | 38 |
| | 30 | 0 | 0 | 0 | 0 | 0 | 0 | 0 | 0 |
| 9 | 0 | 103 | 366 | 189 | 9 | 162 | 156 | 6 | 169 |
| | 1 | 182 | 232 | 244 | 37 | 159 | 88 | 10 | 12 |
| | 10 | 109 | 321 | 36 | 213 | 93 | 293 | 145 | 206 |
| | 11 | 21 | 133 | 286 | 105 | 134 | 111 | 53 | 221 |
| | 13 | 142 | 57 | 151 | 89 | 45 | 92 | 201 | 17 |
| | 17 | 14 | 303 | 267 | 185 | 132 | 152 | 4 | 212 |
| | 18 | 61 | 63 | 135 | 109 | 76 | 23 | 164 | 92 |
| | 20 | 216 | 82 | 209 | 218 | 209 | 337 | 173 | 205 |
| | 31 | 0 | 0 | 0 | 0 | 0 | 0 | 0 | 0 |
| 10 | 1 | 98 | 101 | 14 | 82 | 178 | 175 | 126 | 116 |
| | 2 | 149 | 339 | 80 | 165 | 1 | 253 | 77 | 151 |
| | 4 | 167 | 274 | 211 | 174 | 28 | 27 | 156 | 70 |
| | 7 | 160 | 111 | 75 | 19 | 267 | 231 | 16 | 230 |
| | 8 | 49 | 383 | 161 | 194 | 234 | 49 | 12 | 115 |
| | 14 | 58 | 354 | 311 | 103 | 201 | 267 | 70 | 84 |
| | 32 | 0 | 0 | 0 | 0 | 0 | 0 | 0 | 0 |
| 11 | 0 | 77 | 48 | 16 | 52 | 55 | 25 | 184 | 45 |
| | 1 | 41 | 102 | 147 | 11 | 23 | 322 | 194 | 115 |
| | 12 | 83 | 8 | 290 | 2 | 274 | 200 | 123 | 134 |
| | 16 | 182 | 47 | 289 | 35 | 181 | 351 | 16 | 1 |
| | 21 | 78 | 188 | 177 | 32 | 273 | 166 | 104 | 152 |
| | 22 | 252 | 334 | 43 | 84 | 39 | 338 | 109 | 165 |
| | 23 | 22 | 115 | 280 | 201 | 26 | 192 | 124 | 107 |
| | 33 | 0 | 0 | 0 | 0 | 0 | 0 | 0 | 0 |
| 12 | 0 | 160 | 77 | 229 | 142 | 225 | 123 | 6 | 186 |
| | 1 | 42 | 186 | 235 | 175 | 162 | 217 | 20 | 215 |
| | 10 | 21 | 174 | 169 | 136 | 244 | 142 | 203 | 124 |
| | 11 | 32 | 232 | 48 | 3 | 151 | 110 | 153 | 180 |
| | 13 | 234 | 50 | 105 | 28 | 238 | 176 | 104 | 98 |
| | 18 | 7 | 74 | 52 | 182 | 243 | 76 | 207 | 80 |
| | 34 | 0 | 0 | 0 | 0 | 0 | 0 | 0 | 0 |
| 13 | 0 | 177 | 313 | 39 | 81 | 231 | 311 | 52 | 220 |
| | 3 | 248 | 177 | 302 | 56 | 0 | 251 | 147 | 185 |
| | 7 | 151 | 266 | 303 | 72 | 216 | 265 | 1 | 154 |
| | 20 | 185 | 115 | 160 | 217 | 47 | 94 | 16 | 178 |
| | 23 | 62 | 370 | 37 | 78 | 36 | 81 | 46 | 150 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |

TABLE 1-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 15 | 0 | 40 | 241 | 229 | 90 | 170 | 176 | 173 | 39 |
| | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 130 | 209 | 108 | 81 | 182 | 173 |
| | 18 | 75 | 55 | 184 | 209 | 68 | 176 | 53 | 142 |
| | 25 | 179 | 269 | 51 | 81 | 64 | 113 | 46 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 198 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 182 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 148 | 14 |
| | 40 | 0 | 0 | 0 | 0 | 0 | 0 | 0 | 0 |
| 19 | 0 | 60 | 145 | 64 | 8 | 0 | 87 | 12 | 179 |
| | 1 | 73 | 213 | 181 | 6 | 0 | 110 | 6 | 108 |
| | 7 | 72 | 344 | 101 | 103 | 118 | 147 | 166 | 159 |
| | 8 | 127 | 242 | 270 | 198 | 144 | 258 | 184 | 138 |
| | 10 | 224 | 197 | 41 | 8 | 0 | 204 | 191 | 196 |
| | 41 | 0 | 0 | 0 | 0 | 0 | 0 | 0 | 0 |
| 20 | 0 | 151 | 187 | 301 | 105 | 265 | 89 | 6 | 77 |
| | 3 | 186 | 206 | 162 | 210 | 81 | 65 | 12 | 187 |
| | 9 | 217 | 264 | 40 | 121 | 90 | 155 | 15 | 203 |
| | 11 | 47 | 341 | 130 | 214 | 144 | 244 | 5 | 167 |
| | 22 | 160 | 59 | 10 | 183 | 228 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 58 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 156 | 24 | 249 | 88 | 180 | 18 | 45 | 185 |
| | 2 | 147 | 89 | 50 | 203 | 0 | 6 | 18 | 127 |
| | 10 | 170 | 61 | 133 | 168 | 0 | 181 | 132 | 117 |
| | 18 | 152 | 27 | 105 | 122 | 165 | 304 | 100 | 199 |
| | 45 | 0 | 0 | 0 | 0 | 0 | 0 | 0 | 0 |
| 24 | 0 | 112 | 298 | 289 | 49 | 236 | 38 | 9 | 32 |
| | 3 | 86 | 158 | 280 | 157 | 199 | 170 | 125 | 178 |
| | 4 | 236 | 235 | 110 | 64 | 0 | 249 | 191 | 2 |
| | 11 | 116 | 339 | 187 | 193 | 266 | 288 | 28 | 156 |
| | 22 | 222 | 234 | 281 | 124 | 0 | 194 | 6 | 58 |
| | 46 | 0 | 0 | 0 | 0 | 0 | 0 | 0 | 0 |
| 25 | 1 | 23 | 72 | 172 | 1 | 205 | 279 | 4 | 27 |
| | 6 | 136 | 17 | 295 | 166 | 0 | 255 | 74 | 141 |
| | 7 | 116 | 383 | 96 | 65 | 0 | 111 | 16 | 11 |
| | 14 | 182 | 312 | 46 | 81 | 183 | 54 | 28 | 181 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 165 |
| | 6 | 104 | 194 | 29 | 141 | 36 | 326 | 140 | 232 |
| | 8 | 194 | 101 | 304 | 174 | 72 | 268 | 22 | 9 |
| | 49 | 0 | 0 | 0 | 0 | 0 | 0 | 0 | 0 |

TABLE 1-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 28 | 0 | 128 | 222 | 11 | 146 | 275 | 102 | 4 | 32 |
| | 4 | 165 | 19 | 293 | 153 | 0 | 1 | 1 | 43 |
| | 19 | 181 | 244 | 50 | 217 | 155 | 40 | 40 | 200 |
| | 21 | 63 | 274 | 234 | 114 | 62 | 167 | 93 | 205 |
| | 50 | 0 | 0 | 0 | 0 | 0 | 0 | 0 | 0 |
| 29 | 1 | 86 | 252 | 27 | 150 | 0 | 273 | 92 | 232 |
| | 14 | 236 | 5 | 308 | 11 | 180 | 104 | 136 | 32 |
| | 18 | 84 | 147 | 117 | 53 | 0 | 243 | 106 | 118 |
| | 25 | 6 | 78 | 29 | 68 | 42 | 107 | 6 | 103 |
| | 51 | 0 | 0 | 0 | 0 | 0 | 0 | 0 | 0 |
| 30 | 0 | 216 | 159 | 91 | 34 | 0 | 171 | 2 | 170 |
| | 10 | 73 | 229 | 23 | 130 | 90 | 16 | 88 | 199 |
| | 13 | 120 | 260 | 105 | 210 | 252 | 95 | 112 | 26 |
| | 24 | 9 | 90 | 135 | 123 | 173 | 212 | 20 | 105 |
| | 52 | 0 | 0 | 0 | 0 | 0 | 0 | 0 | 0 |
| 31 | 1 | 95 | 100 | 222 | 175 | 144 | 101 | 4 | 73 |
| | 7 | 177 | 215 | 308 | 49 | 144 | 297 | 49 | 149 |
| | 22 | 172 | 258 | 66 | 177 | 166 | 279 | 125 | 175 |
| | 25 | 61 | 256 | 162 | 128 | 19 | 222 | 194 | 108 |
| | 53 | 0 | 0 | 0 | 0 | 0 | 0 | 0 | 0 |
| 32 | 0 | 221 | 102 | 210 | 192 | 0 | 351 | 6 | 103 |
| | 12 | 112 | 201 | 22 | 209 | 211 | 265 | 126 | 110 |
| | 14 | 199 | 175 | 271 | 58 | 36 | 338 | 63 | 151 |
| | 24 | 121 | 287 | 217 | 30 | 162 | 83 | 20 | 211 |
| | 54 | 0 | 0 | 0 | 0 | 0 | 0 | 0 | 0 |
| 33 | 1 | 2 | 323 | 170 | 114 | 0 | 56 | 10 | 199 |
| | 2 | 187 | 8 | 20 | 49 | 0 | 304 | 30 | 132 |
| | 11 | 41 | 361 | 140 | 161 | 76 | 141 | 6 | 172 |
| | 21 | 211 | 105 | 33 | 137 | 18 | 101 | 92 | 65 |
| | 55 | 0 | 0 | 0 | 0 | 0 | 0 | 0 | 0 |
| 34 | 0 | 127 | 230 | 187 | 82 | 197 | 60 | 4 | 161 |
| | 7 | 167 | 148 | 296 | 186 | 0 | 320 | 153 | 237 |
| | 15 | 164 | 202 | 5 | 68 | 108 | 112 | 197 | 142 |
| | 17 | 159 | 312 | 44 | 150 | 0 | 54 | 155 | 180 |
| | 56 | 0 | 0 | 0 | 0 | 0 | 0 | 0 | 0 |
| 35 | 1 | 161 | 320 | 207 | 192 | 199 | 100 | 4 | 231 |
| | 6 | 197 | 335 | 158 | 173 | 278 | 210 | 45 | 174 |
| | 12 | 207 | 2 | 55 | 26 | 0 | 195 | 168 | 145 |
| | 22 | 103 | 266 | 285 | 187 | 205 | 268 | 185 | 100 |
| | 57 | 0 | 0 | 0 | 0 | 0 | 0 | 0 | 0 |
| 36 | 0 | 37 | 210 | 259 | 222 | 216 | 135 | 6 | 11 |
| | 14 | 105 | 313 | 179 | 157 | 16 | 15 | 200 | 207 |
| | 15 | 51 | 297 | 178 | 0 | 0 | 35 | 177 | 42 |
| | 18 | 120 | 21 | 160 | 6 | 0 | 188 | 43 | 100 |
| | 58 | 0 | 0 | 0 | 0 | 0 | 0 | 0 | 0 |
| 37 | 1 | 198 | 269 | 298 | 81 | 72 | 319 | 82 | 59 |
| | 13 | 220 | 82 | 15 | 195 | 144 | 236 | 2 | 204 |
| | 23 | 122 | 115 | 115 | 138 | 0 | 85 | 135 | 161 |
| | 59 | 0 | 0 | 0 | 0 | 0 | 0 | 0 | 0 |
| 38 | 0 | 167 | 185 | 151 | 123 | 190 | 164 | 91 | 121 |
| | 9 | 151 | 177 | 179 | 90 | 0 | 196 | 64 | 90 |
| | 10 | 157 | 289 | 64 | 73 | 0 | 209 | 198 | 26 |
| | 12 | 163 | 214 | 181 | 10 | 0 | 246 | 100 | 140 |
| | 60 | 0 | 0 | 0 | 0 | 0 | 0 | 0 | 0 |
| 39 | 1 | 173 | 258 | 102 | 12 | 153 | 236 | 4 | 115 |
| | 3 | 139 | 93 | 77 | 77 | 0 | 264 | 28 | 188 |
| | 7 | 149 | 346 | 192 | 49 | 165 | 37 | 109 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 157 | 175 | 32 | 67 | 216 | 304 | 10 | 4 |
| | 8 | 137 | 37 | 80 | 45 | 144 | 237 | 84 | 103 |
| | 17 | 149 | 312 | 197 | 96 | 2 | 135 | 12 | 30 |
| | 62 | 0 | 0 | 0 | 0 | 0 | 0 | 0 | 0 |
| 41 | 1 | 167 | 52 | 154 | 23 | 0 | 123 | 2 | 53 |
| | 3 | 173 | 314 | 47 | 215 | 0 | 77 | 75 | 189 |
| | 9 | 139 | 139 | 124 | 60 | 0 | 25 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 149 | 113 | 226 | 114 | 27 | 288 | 163 | 222 |
| | 4 | 157 | 14 | 65 | 91 | 0 | 83 | 10 | 170 |
| | 24 | 137 | 218 | 126 | 78 | 35 | 17 | 162 | 71 |
| | 64 | 0 | 0 | 0 | 0 | 0 | 0 | 0 | 0 |

TABLE 1-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 43 | 1 | 151 | 113 | 228 | 206 | 52 | 210 | 1 | 22 |
| | 16 | 163 | 132 | 69 | 22 | 243 | 3 | 163 | 127 |
| | 18 | 173 | 114 | 176 | 134 | 0 | 53 | 99 | 49 |
| | 25 | 139 | 168 | 102 | 161 | 270 | 167 | 98 | 125 |
| | 65 | 0 | 0 | 0 | 0 | 0 | 0 | 0 | 0 |
| 44 | 0 | 139 | 80 | 234 | 84 | 18 | 79 | 4 | 191 |
| | 7 | 157 | 78 | 227 | 4 | 0 | 244 | 6 | 211 |
| | 9 | 163 | 163 | 259 | 9 | 0 | 293 | 142 | 187 |
| | 22 | 173 | 274 | 260 | 12 | 57 | 272 | 3 | 148 |
| | 66 | 0 | 0 | 0 | 0 | 0 | 0 | 0 | 0 |
| 45 | 1 | 149 | 135 | 101 | 184 | 168 | 82 | 181 | 177 |
| | 6 | 151 | 149 | 228 | 121 | 0 | 67 | 45 | 114 |
| | 10 | 167 | 15 | 126 | 29 | 144 | 235 | 153 | 93 |
| | 67 | 0 | 0 | 0 | 0 | 0 | 0 | 0 | 0 |

TABLE 2

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 0 | 0 | 9 | 174 | 0 | 72 | 3 | 156 | 143 | 145 |
| | 1 | 117 | 97 | 0 | 110 | 26 | 143 | 19 | 131 |
| | 2 | 204 | 166 | 0 | 23 | 53 | 14 | 176 | 71 |
| | 3 | 26 | 66 | 0 | 181 | 35 | 3 | 165 | 21 |
| | 6 | 189 | 71 | 0 | 95 | 115 | 40 | 196 | 23 |
| | 9 | 205 | 172 | 0 | 8 | 127 | 123 | 13 | 112 |
| | 10 | 0 | 0 | 0 | 1 | 0 | 0 | 0 | 1 |
| | 11 | 0 | 0 | 0 | 0 | 0 | 0 | 0 | 0 |
| 1 | 0 | 167 | 27 | 137 | 53 | 19 | 17 | 18 | 142 |
| | 3 | 166 | 36 | 124 | 156 | 94 | 65 | 27 | 174 |
| | 4 | 253 | 48 | 0 | 115 | 104 | 63 | 3 | 183 |
| | 5 | 125 | 92 | 0 | 156 | 66 | 1 | 102 | 27 |
| | 6 | 226 | 31 | 88 | 115 | 84 | 55 | 185 | 96 |
| | 7 | 156 | 187 | 0 | 200 | 98 | 37 | 17 | 23 |
| | 8 | 224 | 185 | 0 | 29 | 69 | 171 | 14 | 9 |
| | 9 | 252 | 3 | 55 | 31 | 50 | 133 | 180 | 167 |
| | 11 | 0 | 0 | 0 | 0 | 0 | 0 | 0 | 0 |
| | 12 | 0 | 0 | 0 | 0 | 0 | 0 | 0 | 0 |
| 2 | 0 | 81 | 25 | 20 | 152 | 95 | 98 | 126 | 74 |
| | 1 | 114 | 114 | 94 | 131 | 106 | 168 | 163 | 31 |
| | 3 | 44 | 117 | 99 | 46 | 92 | 107 | 47 | 3 |
| | 4 | 52 | 110 | 9 | 191 | 110 | 82 | 183 | 53 |
| | 8 | 240 | 114 | 108 | 91 | 111 | 142 | 132 | 155 |
| | 10 | 1 | 1 | 1 | 0 | 1 | 1 | 1 | 0 |
| | 12 | 0 | 0 | 0 | 0 | 0 | 0 | 0 | 0 |
| | 13 | 0 | 0 | 0 | 0 | 0 | 0 | 0 | 0 |
| 3 | 1 | 8 | 136 | 38 | 185 | 120 | 53 | 36 | 239 |
| | 2 | 58 | 175 | 15 | 6 | 121 | 174 | 48 | 171 |
| | 4 | 158 | 113 | 102 | 36 | 22 | 174 | 18 | 95 |
| | 5 | 104 | 72 | 146 | 124 | 4 | 127 | 111 | 110 |
| | 6 | 209 | 123 | 12 | 124 | 73 | 17 | 203 | 159 |
| | 7 | 54 | 118 | 57 | 110 | 49 | 89 | 3 | 199 |
| | 8 | 18 | 28 | 53 | 156 | 128 | 17 | 191 | 43 |
| | 9 | 128 | 186 | 46 | 133 | 79 | 105 | 160 | 75 |
| | 10 | 0 | 0 | 0 | 1 | 0 | 0 | 0 | 1 |
| | 13 | 0 | 0 | 0 | 0 | 0 | 0 | 0 | 0 |
| 4 | 0 | 179 | 72 | 0 | 200 | 42 | 86 | 43 | 29 |
| | 1 | 214 | 74 | 136 | 16 | 24 | 67 | 27 | 140 |
| | 11 | 71 | 29 | 157 | 101 | 51 | 83 | 117 | 180 |
| | 14 | 0 | 0 | 0 | 0 | 0 | 0 | 0 | 0 |
| 5 | 0 | 231 | 10 | 0 | 185 | 40 | 79 | 136 | 121 |
| | 1 | 41 | 44 | 131 | 138 | 140 | 84 | 49 | 41 |
| | 5 | 194 | 121 | 142 | 170 | 84 | 35 | 36 | 169 |
| | 7 | 159 | 80 | 141 | 219 | 137 | 103 | 132 | 88 |
| | 11 | 103 | 48 | 64 | 193 | 71 | 60 | 62 | 207 |
| | 15 | 0 | 0 | 0 | 0 | 0 | 0 | 0 | 0 |

TABLE 2-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 6 | 0 | 155 | 129 | 0 | 123 | 109 | 47 | 7 | 137 |
| | 5 | 228 | 92 | 124 | 55 | 87 | 154 | 34 | 72 |
| | 7 | 45 | 100 | 99 | 31 | 107 | 10 | 198 | 172 |
| | 9 | 28 | 49 | 45 | 222 | 133 | 155 | 168 | 124 |
| | 11 | 158 | 184 | 148 | 209 | 139 | 29 | 12 | 56 |
| | 16 | 0 | 0 | 0 | 0 | 0 | 0 | 0 | 0 |
| 7 | 1 | 129 | 80 | 0 | 103 | 97 | 48 | 163 | 86 |
| | 5 | 147 | 186 | 45 | 13 | 135 | 125 | 78 | 186 |
| | 7 | 140 | 16 | 148 | 105 | 35 | 24 | 143 | 87 |
| | 11 | 3 | 102 | 96 | 150 | 108 | 47 | 107 | 172 |
| | 13 | 116 | 143 | 78 | 181 | 65 | 55 | 58 | 154 |
| | 17 | 0 | 0 | 0 | 0 | 0 | 0 | 0 | 0 |
| 8 | 0 | 142 | 118 | 0 | 147 | 70 | 53 | 101 | 176 |
| | 1 | 94 | 70 | 65 | 43 | 69 | 31 | 177 | 169 |
| | 12 | 230 | 152 | 87 | 152 | 88 | 161 | 22 | 225 |
| | 18 | 0 | 0 | 0 | 0 | 0 | 0 | 0 | 0 |
| 9 | 1 | 203 | 28 | 0 | 2 | 97 | 104 | 186 | 167 |
| | 8 | 205 | 132 | 97 | 30 | 40 | 142 | 27 | 238 |
| | 10 | 61 | 185 | 51 | 184 | 24 | 99 | 205 | 48 |
| | 11 | 247 | 178 | 85 | 83 | 49 | 64 | 81 | 68 |
| | 19 | 0 | 0 | 0 | 0 | 0 | 0 | 0 | 0 |
| 10 | 0 | 11 | 59 | 0 | 174 | 46 | 111 | 125 | 38 |
| | 1 | 185 | 104 | 17 | 150 | 41 | 25 | 60 | 217 |
| | 6 | 0 | 22 | 156 | 8 | 101 | 174 | 177 | 208 |
| | 7 | 117 | 52 | 20 | 56 | 96 | 23 | 51 | 232 |
| | 20 | 0 | 0 | 0 | 0 | 0 | 0 | 0 | 0 |
| 11 | 0 | 11 | 32 | 0 | 99 | 28 | 91 | 39 | 178 |
| | 7 | 236 | 92 | 7 | 138 | 30 | 175 | 29 | 214 |
| | 9 | 210 | 174 | 4 | 110 | 116 | 24 | 35 | 168 |
| | 13 | 56 | 154 | 2 | 99 | 64 | 141 | 8 | 51 |
| | 21 | 0 | 0 | 0 | 0 | 0 | 0 | 0 | 0 |
| 12 | 1 | 63 | 39 | 0 | 46 | 33 | 122 | 18 | 124 |
| | 3 | 111 | 93 | 113 | 217 | 122 | 11 | 155 | 122 |
| | 11 | 14 | 11 | 48 | 109 | 131 | 4 | 49 | 72 |
| | 22 | 0 | 0 | 0 | 0 | 0 | 0 | 0 | 0 |
| 13 | 0 | 83 | 49 | 0 | 37 | 76 | 29 | 32 | 48 |
| | 1 | 2 | 125 | 112 | 113 | 37 | 91 | 53 | 57 |
| | 8 | 38 | 35 | 102 | 143 | 62 | 27 | 95 | 167 |
| | 13 | 222 | 166 | 26 | 140 | 47 | 127 | 186 | 219 |
| | 23 | 0 | 0 | 0 | 0 | 0 | 0 | 0 | 0 |
| 14 | 1 | 115 | 19 | 0 | 36 | 143 | 11 | 91 | 82 |
| | 6 | 145 | 118 | 138 | 95 | 51 | 145 | 20 | 232 |
| | 11 | 3 | 21 | 57 | 40 | 130 | 8 | 52 | 204 |
| | 13 | 232 | 163 | 27 | 116 | 97 | 166 | 109 | 162 |
| | 24 | 0 | 0 | 0 | 0 | 0 | 0 | 0 | 0 |
| 15 | 0 | 51 | 68 | 0 | 116 | 139 | 137 | 174 | 38 |
| | 10 | 175 | 63 | 73 | 200 | 96 | 103 | 108 | 217 |
| | 11 | 213 | 81 | 99 | 110 | 128 | 40 | 102 | 157 |
| | 25 | 0 | 0 | 0 | 0 | 0 | 0 | 0 | 0 |
| 16 | 1 | 203 | 87 | 0 | 75 | 48 | 78 | 125 | 170 |
| | 9 | 142 | 177 | 79 | 158 | 9 | 158 | 31 | 23 |
| | 11 | 8 | 135 | 111 | 134 | 28 | 17 | 54 | 175 |
| | 12 | 242 | 64 | 143 | 97 | 8 | 165 | 176 | 202 |
| | 26 | 0 | 0 | 0 | 0 | 0 | 0 | 0 | 0 |
| 17 | 1 | 254 | 158 | 0 | 48 | 120 | 134 | 57 | 196 |
| | 5 | 124 | 23 | 24 | 132 | 43 | 23 | 201 | 173 |
| | 11 | 114 | 9 | 109 | 206 | 65 | 62 | 142 | 195 |
| | 12 | 64 | 6 | 18 | 2 | 42 | 163 | 35 | 218 |
| | 27 | 0 | 0 | 0 | 0 | 0 | 0 | 0 | 0 |
| 18 | 0 | 220 | 186 | 0 | 68 | 17 | 173 | 129 | 128 |
| | 6 | 194 | 6 | 18 | 16 | 106 | 31 | 203 | 211 |
| | 7 | 50 | 46 | 86 | 156 | 142 | 22 | 140 | 210 |
| | 28 | 0 | 0 | 0 | 0 | 0 | 0 | 0 | 0 |
| 19 | 0 | 87 | 58 | 0 | 35 | 79 | 13 | 110 | 39 |
| | 1 | 20 | 42 | 158 | 138 | 28 | 135 | 124 | 84 |
| | 10 | 185 | 156 | 154 | 86 | 41 | 145 | 52 | 88 |
| | 29 | 0 | 0 | 0 | 0 | 0 | 0 | 0 | 0 |
| 20 | 1 | 26 | 76 | 0 | 6 | 2 | 128 | 196 | 117 |
| | 4 | 105 | 61 | 148 | 20 | 103 | 52 | 35 | 227 |
| | 11 | 29 | 153 | 104 | 141 | 78 | 173 | 114 | 6 |
| | 30 | 0 | 0 | 0 | 0 | 0 | 0 | 0 | 0 |

TABLE 2-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 21 | 0 | 76 | 157 | 0 | 80 | 91 | 156 | 10 | 238 |
| | 8 | 42 | 175 | 17 | 43 | 75 | 166 | 122 | 13 |
| | 13 | 210 | 67 | 33 | 81 | 81 | 40 | 23 | 11 |
| | 31 | 0 | 0 | 0 | 0 | 0 | 0 | 0 | 0 |
| 22 | 1 | 222 | 20 | 0 | 49 | 54 | 18 | 202 | 195 |
| | 2 | 63 | 52 | 4 | 1 | 132 | 163 | 126 | 44 |
| | 32 | 0 | 0 | 0 | 0 | 0 | 0 | 0 | 0 |
| 23 | 0 | 23 | 106 | 0 | 156 | 68 | 110 | 52 | 5 |
| | 3 | 235 | 86 | 75 | 54 | 115 | 132 | 170 | 94 |
| | 5 | 238 | 95 | 158 | 134 | 56 | 150 | 13 | 111 |
| | 33 | 0 | 0 | 0 | 0 | 0 | 0 | 0 | 0 |
| 24 | 1 | 46 | 182 | 0 | 153 | 30 | 113 | 113 | 81 |
| | 2 | 139 | 153 | 69 | 88 | 42 | 108 | 161 | 19 |
| | 9 | 8 | 64 | 87 | 63 | 101 | 61 | 88 | 130 |
| | 34 | 0 | 0 | 0 | 0 | 0 | 0 | 0 | 0 |
| 25 | 0 | 228 | 45 | 0 | 211 | 128 | 72 | 197 | 66 |
| | 5 | 156 | 21 | 65 | 94 | 63 | 136 | 194 | 95 |
| | 35 | 0 | 0 | 0 | 0 | 0 | 0 | 0 | 0 |
| 26 | 2 | 29 | 67 | 0 | 90 | 142 | 36 | 164 | 146 |
| | 7 | 143 | 137 | 100 | 6 | 28 | 38 | 172 | 66 |
| | 12 | 160 | 55 | 13 | 221 | 100 | 53 | 49 | 190 |
| | 13 | 122 | 85 | 7 | 6 | 133 | 145 | 161 | 86 |
| | 36 | 0 | 0 | 0 | 0 | 0 | 0 | 0 | 0 |
| 27 | 0 | 8 | 103 | 0 | 27 | 13 | 42 | 168 | 64 |
| | 6 | 151 | 50 | 32 | 118 | 10 | 104 | 193 | 181 |
| | 37 | 0 | 0 | 0 | 0 | 0 | 0 | 0 | 0 |
| 28 | 1 | 98 | 70 | 0 | 216 | 106 | 64 | 14 | 7 |
| | 2 | 101 | 111 | 126 | 212 | 77 | 24 | 186 | 144 |
| | 5 | 135 | 168 | 110 | 193 | 43 | 149 | 46 | 16 |
| | 38 | 0 | 0 | 0 | 0 | 0 | 0 | 0 | 0 |
| 29 | 0 | 18 | 110 | 0 | 108 | 133 | 139 | 50 | 25 |
| | 4 | 28 | 17 | 154 | 61 | 25 | 161 | 27 | 57 |
| | 39 | 0 | 0 | 0 | 0 | 0 | 0 | 0 | 0 |
| 30 | 2 | 71 | 120 | 0 | 106 | 87 | 84 | 70 | 37 |
| | 5 | 240 | 154 | 35 | 44 | 56 | 173 | 17 | 139 |
| | 7 | 9 | 52 | 51 | 185 | 104 | 93 | 50 | 221 |
| | 9 | 84 | 56 | 134 | 176 | 70 | 29 | 6 | 17 |
| | 40 | 0 | 0 | 0 | 0 | 0 | 0 | 0 | 0 |
| 31 | 1 | 106 | 3 | 0 | 147 | 80 | 117 | 115 | 201 |
| | 13 | 1 | 170 | 20 | 182 | 139 | 148 | 189 | 46 |
| | 41 | 0 | 0 | 0 | 0 | 0 | 0 | 0 | 0 |
| 32 | 0 | 242 | 84 | 0 | 108 | 32 | 116 | 110 | 179 |
| | 5 | 44 | 8 | 20 | 21 | 89 | 73 | 0 | 14 |
| | 12 | 166 | 17 | 122 | 110 | 71 | 142 | 163 | 116 |
| | 42 | 0 | 0 | 0 | 0 | 0 | 0 | 0 | 0 |
| 33 | 2 | 132 | 165 | 0 | 71 | 135 | 105 | 163 | 46 |
| | 7 | 164 | 179 | 88 | 12 | 6 | 137 | 173 | 2 |
| | 10 | 235 | 124 | 13 | 109 | 2 | 29 | 179 | 106 |
| | 43 | 0 | 0 | 0 | 0 | 0 | 0 | 0 | 0 |
| 34 | 0 | 147 | 173 | 0 | 29 | 37 | 11 | 197 | 184 |
| | 12 | 85 | 177 | 19 | 201 | 25 | 41 | 191 | 135 |
| | 13 | 36 | 12 | 78 | 69 | 114 | 162 | 193 | 141 |
| | 44 | 0 | 0 | 0 | 0 | 0 | 0 | 0 | 0 |
| 35 | 1 | 57 | 77 | 0 | 91 | 60 | 126 | 157 | 85 |
| | 5 | 40 | 184 | 157 | 165 | 137 | 152 | 167 | 225 |
| | 11 | 63 | 18 | 6 | 55 | 93 | 172 | 181 | 175 |
| | 45 | 0 | 0 | 0 | 0 | 0 | 0 | 0 | 0 |
| 36 | 0 | 140 | 25 | 0 | 1 | 121 | 73 | 197 | 178 |
| | 2 | 38 | 151 | 63 | 175 | 129 | 154 | 167 | 112 |
| | 7 | 154 | 170 | 82 | 83 | 26 | 129 | 179 | 106 |
| | 46 | 0 | 0 | 0 | 0 | 0 | 0 | 0 | 0 |
| 37 | 10 | 219 | 37 | 0 | 40 | 97 | 167 | 181 | 154 |
| | 13 | 151 | 31 | 144 | 12 | 56 | 38 | 193 | 114 |
| | 47 | 0 | 0 | 0 | 0 | 0 | 0 | 0 | 0 |
| 38 | 1 | 31 | 84 | 0 | 37 | 1 | 112 | 157 | 42 |
| | 5 | 66 | 151 | 93 | 97 | 70 | 7 | 173 | 41 |
| | 11 | 38 | 190 | 19 | 46 | 1 | 19 | 191 | 105 |
| | 48 | 0 | 0 | 0 | 0 | 0 | 0 | 0 | 0 |
| 39 | 0 | 239 | 93 | 0 | 106 | 119 | 109 | 181 | 167 |
| | 7 | 172 | 132 | 24 | 181 | 32 | 6 | 157 | 45 |
| | 12 | 34 | 57 | 138 | 154 | 142 | 105 | 173 | 189 |
| | 49 | 0 | 0 | 0 | 0 | 0 | 0 | 0 | 0 |

TABLE 2-continued

| $H_{BG}$ | | $V_{i,j}$ | | | | | | | |
|---|---|---|---|---|---|---|---|---|---|
| Row index | Column | Set index $i_{LS}$ | | | | | | | |
| i | index j | 0 | 1 | 2 | 3 | 4 | 5 | 6 | 7 |
| 40 | 2 | 0 | 103 | 0 | 98 | 6 | 160 | 193 | 78 |
| | 10 | 75 | 107 | 36 | 35 | 73 | 156 | 163 | 67 |
| | 13 | 120 | 163 | 143 | 36 | 102 | 82 | 179 | 180 |
| | 50 | 0 | 0 | 0 | 0 | 0 | 0 | 0 | 0 |
| 41 | 1 | 129 | 147 | 0 | 120 | 48 | 132 | 191 | 53 |
| | 5 | 229 | 7 | 2 | 101 | 47 | 6 | 197 | 215 |
| | 11 | 118 | 60 | 55 | 81 | 19 | 8 | 167 | 230 |
| | 51 | 0 | 0 | 0 | 0 | 0 | 0 | 0 | 0 |

A UE or a base station can be configured with rules for selection of base graph 1 or 2. In one configuration, if CBS≤292, or if CBS≤3824 and CR≤0.67, or if CR≤0.25, then LDPC base graph 2 should be used. Otherwise, LDPC base graph 1 is used.

In one aspect, when the LDPC base graph 2 is used in combination with the selection of Kb being 10, lifting factor Z may limit performance of QC LDPC codes. Various configurations described below contemplate different rules to address this problem and further enhance QC LDPC code performance.

In some configurations, selection of LDPC base graph 1 or 2 may be performed based on CBS and CR values. Typically, the LDPC base graph 1 performs better than the base graph 2 with higher CR values and larger CBS values. The LDPC base graph 2 performs better than the base graph 1 with lower CR values and smaller CBS values. In certain configurations, the first base graph (LDPC base graph 1) can be used for the initial transmission and the subsequent re-transmissions of the same transport block if: 1) CBS>3840 or if 2) CR value of the initial transmission>0.67. In certain configurations, the second base graph (LDPC base graph 2) can be used for the initial transmission and the subsequent re-transmissions of the same transport block if: 1) CBS≤3840 and if 2) CR value of the initial transmission≤0.67.

Further, once a particular base graph is selected, the below technique may be used to determine an optimal Kb number. For example, when CBS ranges between 40 and 656, the UE or the base station may be configured to use a Kb number in the range of 5 to 10. An optimal Kb number can be determined when a sum of absolute SNR values where a Block Error Rate (BLER) at a receiver is $10^{-2}$ and where the BLER is $10^{4}$ is minimum with all candidate CRs and the given Kb value. For instance, a particular Kb number (e.g. Kb=5) from the candidate Kb numbers may be selected for a target CBS (e.g., CBS=40) to generate a cumulative sum of SNR measurements at where the BLER is $10^{-4}$ and where the BLER is $10^{4}$ for all the candidate CR values. In one configuration, the CR values used for the determination of an optimal Kb number may include ⅕, ⅓, ⅖, ½, ⅔. As such, the cumulative sum of SNR measurements for all the candidate CR values at Kb number 5 is determined for the target CBS. Subsequently, another Kb number (e.g., Kb number=6) from the candidate Kb numbers may be selected, and the corresponding cumulative sum of SNR values may be calculated. This process is repeated for the entire range of candidate Kb numbers (e.g., 5 to 10). An optimal Kb number can be determined as the Kb number that produces the lowest cumulative sum of SNR measurements as described above. This selection process of an optimal Kb number can be described using the following Equation (2):

$$Kb^* = \underset{Kb}{\operatorname{argmin}} \sum_{CR} [SNR_{@10^{-2}}(CR, Kb) + SNR_{@10^{-4}}(CR, Kb)]$$

In one example, optimal Kb numbers for LDPC base graph 2 for different CBSs are determined based on the Equation (2). In particular, if the CBS is greater than 640, the optimal Kb number is 10. If the CBS is not greater than 640 and is greater than 560, the optimal Kb number is 9. If the CBS is not greater than 560 and is greater than 192, the optimal Kb number is 8. If the CBS is not greater than 192, the optimal Kb number is 6.

Figure 9:
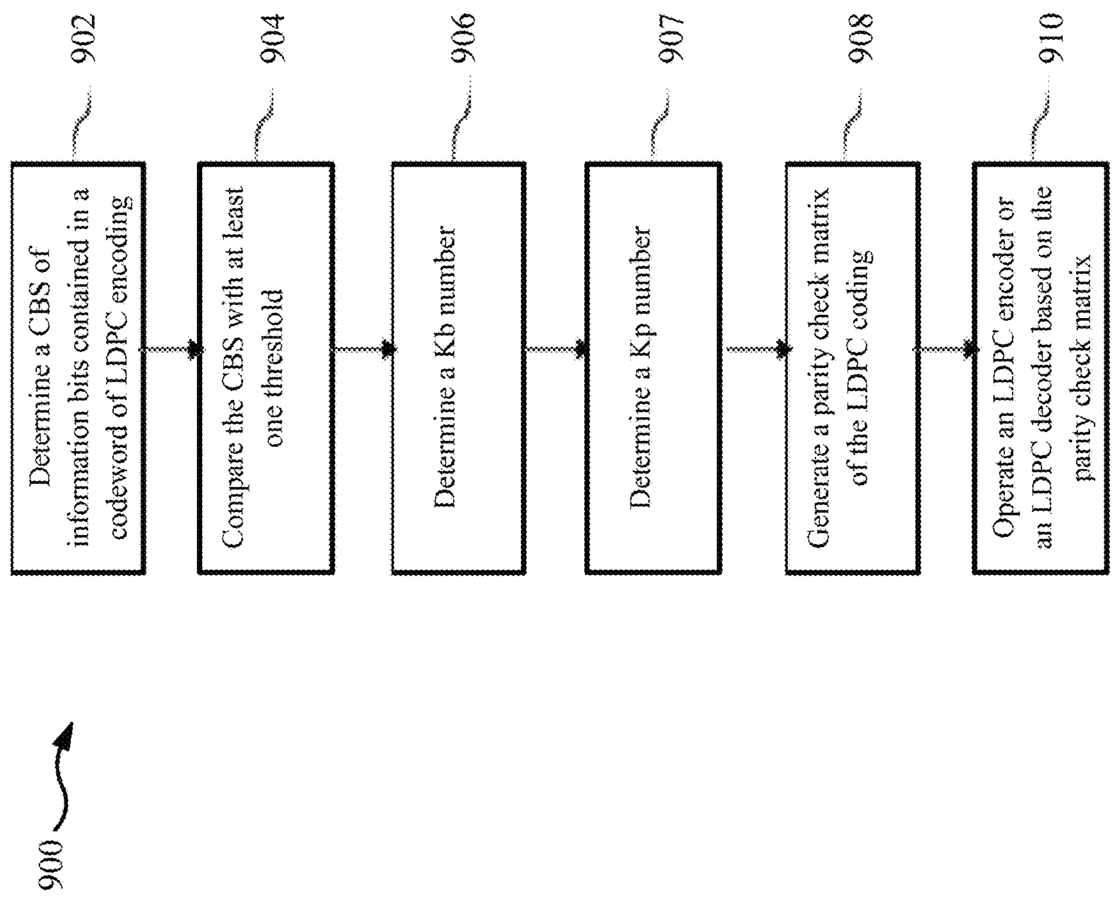
FIG. 9 is a flow chart 900 of a method (process) for using improved QC-LDPC codes.

FIG. 9 is a flow chart 900 of a method (process) for using improved QC-LDPC codes. The method may be performed by a UE (e.g., the UE 104, the UE 350, the apparatus 1002/1002') or by a base station (e.g., base station 102, base station 310, the apparatus 1002/1002'). It is noteworthy that, although the description below is provided in the context of UE(s), the description below is also applicable to base station(s). At operation 902, the UE or base station determines a CBS of information bits contained in a codeword of LDPC coding. As noted above, each LDPC codeword includes both an information portion and a parity portion. Thus, at operation 902, the UE OR BASE STATION determines the length of the information portion. At operation 904, the UE OR BASE STATION compares the determined CBS with at least one predefined threshold as explained below. This comparison is performed in order to determine an optimal Kb number.

At operation 906, the UE OR BASE STATION determines an optimal Kb number for LDPC base graph 2 using the following rules:

If CBS>640, use Kb=10
Else if 640≥CBS>560, use Kb=9
Else if 560≥CBS>192, use Kb=8
Else if CBS≤192, use Kb=6.

At operation 907, the UE OR BASE STATION determines a Kp number. The Kp number is determined based on the Kb number and the code rate.

At operation 908, the UE OR BASE STATION generates a parity check matrix (e.g., the parity check matrix 812) of the LDPC coding using the determined optimal Kb number. As noted above, the parity check matrix 812 has two portions. A first portion 816 represent information bits portion and a second portion 818 represents a parity bits portion. The parity check matrix 812 may also include at least one sub-matrix 814.

At operation 910, the UE OR BASE STATION operates an LDPC encoder (e.g., LDPC encoder 192 shown in FIG. 1) or an LDPC decoder (e.g., LDPC decoder 194) based on the parity check matrix (e.g., the parity check matrix 812). In other words, LDPC coding/decoding is carried out by special purpose logic within LDPC encoder/decoder circuitry. This special purpose logic utilizes the generated parity check matrix.

In certain configurations, the at least one threshold includes a first threshold of 640 bits and the Kb number is determined to be 10 when the CBS is greater than the first threshold.

In certain configurations, the at least one threshold includes a first threshold of 640 bits and the second threshold of 560 bits and the Kb number is determined to be 9 when the CBS is less than or equal to the first threshold and is greater than the second threshold.

In certain configurations, at least one threshold includes a first threshold of 560 bits and the second threshold of 192 bits and the Kb number is determined to be 8 when the CBS is less than or equal to the first threshold and is greater than the second threshold.

In certain configurations, the at least one threshold includes a first threshold of 192 bits and the Kb number is determined to be 6 when the CBS is less than or equal to the first threshold.

In certain configurations, the circular permutation matrices are located at locations of the first matrix as indicated by an adopted base graph.

In certain configurations, a first base graph or a second base graph is selected to be the adopted base graph based on at least one the CBS and a code rate of an initial transmission.

In certain configurations, the second base graph is selected when the CBS is less than or equal to 3840 bits and the code rate is less than or equal to 0.67.

Figure 10:
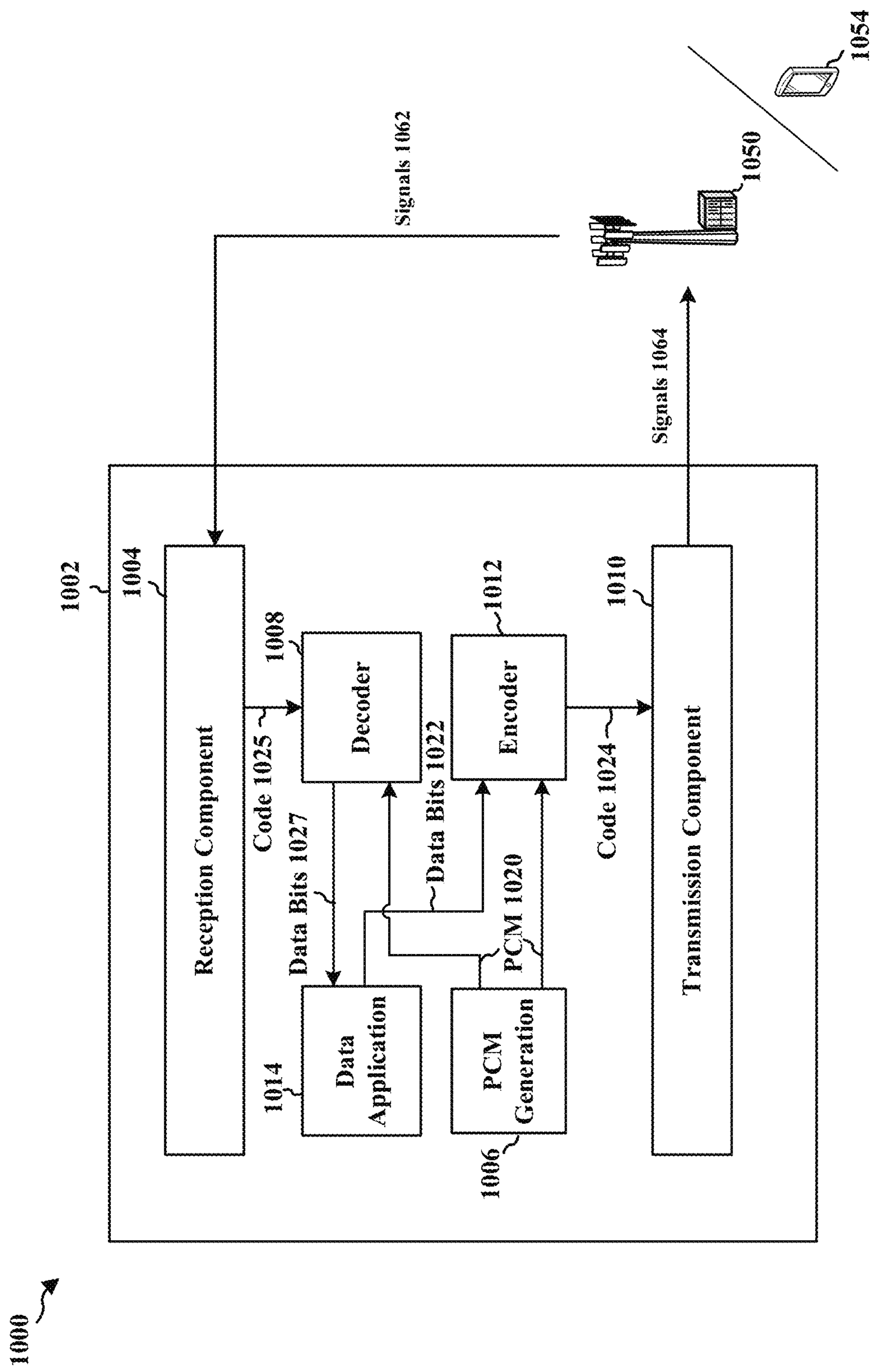
FIG. 10 is a block diagram of an example communications system.

FIG. 10 is a conceptual data flow diagram 1000 illustrating the data flow between different components/means in an exemplary apparatus 1002. The apparatus 1002 may be either a UE or a base station. The apparatus 1002 includes a reception component 1004, a PCM generation component 1006, an encoder 1012, a decoder 1008, a transmission component 1010 and a data application 1014. If the apparatus 1002 is a UE then the reception component 1004 may receive signals 1062 from a base station 1050 and the transmission component 1010 may send signals 1064 to the base station 1050. If the apparatus 1002 is a base station then the reception component 1004 may receive signals 1062 from a UE 1054 and the transmission component 1010 may send signals 1064 to the UE 1054.

In certain configurations, the PCM generation component 1006 is pre-configured to determine a CBS of information bits contained in a codeword of LDPC coding. In other words, the PCM generation component 1006 is pre-configured to determine the length of the information portion of a LDPC codeword. The PCM generation component 1006 compares the determined CBS with at least one threshold.

Based on a result of the performed comparison, the PCM generation component 1006 determines a Kb number. When the at least one threshold includes only one threshold of 640 bits and when the CBS is greater than 640 bits, the PCM generation component 1006 determines the Kb number to be 10. When the CBS is compared to two different thresholds of 560 bits and 640 bits and when the CBS is greater than 560 bits and the CBS is less than or equal to 640 bits, the PCM generation component 1006 determines the KB number to be 9. When the CBS is compared to two different thresholds of 192 bits and 560 bits and when the CBS is greater than 192 bits and the CBS is less than or equal to 560 bits, the PCM generation component 1006 determines the KB number to be 8. When the at least one threshold includes only one threshold of 192 bits and when the CBS is less than or equal to 192 bits, the PCM generation component 1006 determines the Kb number to be 6.

In certain configurations, the PCM generation component 1006 selects either a first base graph or a second base graph to be the adopted base graph based on at least one the determined CBS and a code rate of an initial transmission. When the CBS is less than or equal to 3840 and the code rate is less than or equal to 0.67, the PCM generation component 1006 selects the second base graph to be the adopted base graph. The adopted base graph defines a structure of the parity check matrix. The PCM generation component 1006 generates a parity check matrix 1020 of the LDPC coding using the adopted base graph and the determined Kb number. Based on the determined Kb number, the PCM generation component 1006 uses either the entire or only a selected portion of the adopted base graph to generate the parity check matrix. The selected portion is formed by two parts with one part including a subset of the information columns of the parity check matrix and a second part including a subset of parity columns of the parity check matrix. The number of information columns used by the selected portion is the determined Kb number and the number of parity columns used by the selected portion is a determined Kp number. An information portion of the parity check matrix is formed by M number of square matrices. M is equal to Kp*Kb. A total number of columns in the Kb number of square matrices is equal to a total number of bits of the CBS. One or more of the M number of square matrices are circular permutation matrices. The circular permutation matrices are located at locations of the information portion of the parity check matrix as indicated by the adopted base graph.

In one aspect, the encoder 1012 receives data bits 1022 from a data application 1014 and encodes the data bits 1022 using a generator matrix derived from the parity check matrix 1020 generated by the PCM generation component 1006 to generate a LDPC code 1024. In certain configurations, the encoder 1012 sends the generated LDPC code 1024 to the transmission component 1010. In one aspect, the decoder 1008 decodes a LDPC code 1025 received from the reception component 1004 to generate data bits 1027. In certain configurations, the decoder 1008 may send the generated data bits 1027 to the data application 1014. In various configurations, the data application 1014 may generally be any application that facilitates the operations of an organization (or multiple affiliated organizations), and can include, without limitation, mail server applications, file server applications, mail client applications, database applications, word processing applications, spreadsheet applications, financial applications, presentation applications, browser applications, mobile applications, entertainment applications, and so on.

Figure 11:
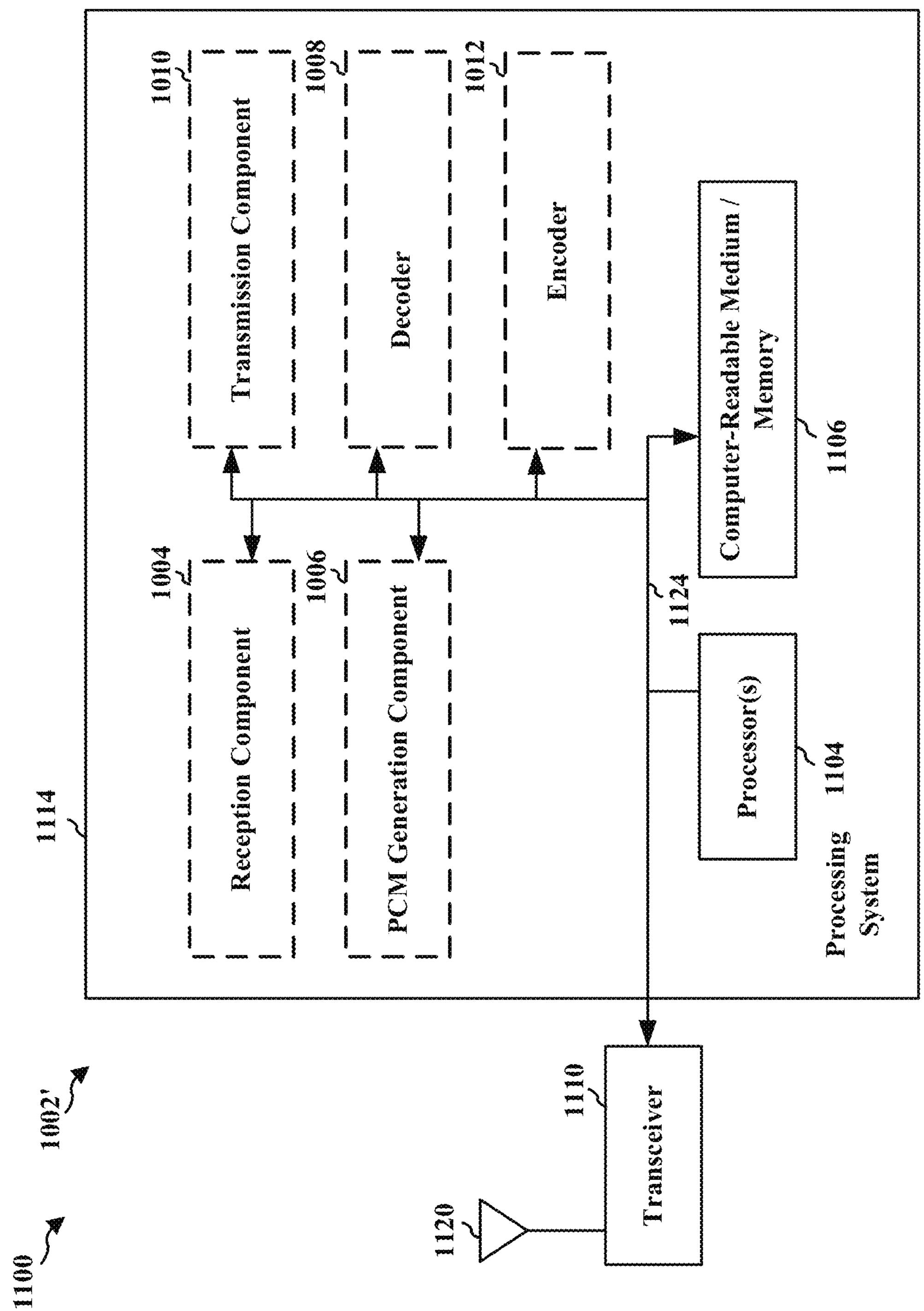
FIG. 11 is a diagram illustrating an example of a hardware implementation.

FIG. 11 is a diagram 1100 illustrating an example of a hardware implementation for an apparatus 1002' employing a processing system 1114. The apparatus 1002' may be a UE or a base station. The processing system 1114 may be implemented with a bus architecture, represented generally by a bus 1124. The bus 1124 may include any number of interconnecting buses and bridges depending on the specific application of the processing system 1114 and the overall design constraints. The bus 1124 links together various circuits including one or more processors and/or hardware components, represented by one or more processors 1104, the reception component 1004, the PCM generation component 1006, the decoder 1008, the transmission component 1010, and the encoder 1012, and a computer-readable medium/memory 1106. The bus 1124 may also link various other circuits such as timing sources, peripherals, voltage regulators, and power management circuits, etc.

The processing system 1114 may be coupled to a transceiver 1110, which may be one or more of the transceivers 354 if the apparatus 1102' is a UE or one or more transceivers 318 if the apparatus 1102' is a base station. The transceiver 1110 is coupled to one or more antennas 1120, which may be the communication antennas 352 if the apparatus 1102' is a UE or the communication antennas 320 if the apparatus 1102' is a base station.

The transceiver 1110 provides a means for communicating with various other apparatus over a transmission medium. The transceiver 1110 receives a signal from the one or more antennas 1120, extracts information from the received signal, and provides the extracted information to the processing system 1114, specifically the reception component 1004. In addition, the transceiver 1110 receives information from the processing system 1114, specifically the transmission component 1010, and based on the received information, generates a signal to be applied to the one or more antennas 1120.

The processing system 1114 includes one or more processors 1104 coupled to a computer-readable medium/memory 1106. The one or more processors 1104 are responsible for general processing, including the execution of software stored on the computer-readable medium/memory 1106. The software, when executed by the one or more processors 1104, causes the processing system 1114 to perform the various functions described supra for any particular apparatus. The computer-readable medium/memory 1106 may also be used for storing data that is manipulated by the one or more processors 1104 when executing software. The processing system 1114 further includes at least one of the reception component 1004, the PCM generation component 1006, the decoder 1008, the transmission component 1010, and the encoder 1012. The components may be software components running in the one or more processors 1104, resident/stored in the computer readable medium/memory 1106, one or more hardware components coupled to the one or more processors 1104, or some combination thereof. In one configuration, the processing system 1114 may be a component of the UE 350 and may include the memory 360 and/or at least one of the TX processor 368, the RX processor 356, and the communication processor 359. In another configuration, the processing system 1114 may be a component of the base station 310 and may include the memory 376 and/or at least one of the TX processor 316, the RX processor 370, and the communication processor 375

In one configuration, the apparatus 1002/apparatus 1002' for wireless communication includes means for performing each of the operations of FIG. 9. The aforementioned means may be one or more of the aforementioned components of the apparatus 1002 and/or the processing system 1114 of the apparatus 1002' configured to perform the functions recited by the aforementioned means.

As described supra, the processing system 1114 may include the TX Processor 368, the RX Processor 356, and the communication processor 359 or may include the TX processor 316, the RX processor 370, and the communication processor 375. As such, in one configuration, the aforementioned means may be the TX Processor 368, the RX Processor 356, and the communication processor 359 configured to perform the functions recited by the aforementioned means. In another configuration, the aforementioned means may be the TX Processor 316, the RX Processor 370, and the communication processor 375 configured to perform the functions recited by the aforementioned means. It is understood that the specific order or hierarchy of blocks in the processes/flowcharts disclosed is an illustration of exemplary approaches. Based upon design preferences, it is understood that the specific order or hierarchy of blocks in the processes/ flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a user equipment (UE) or a base station, comprising:

determining a code block size (CBS) of information bits contained in a codeword of low-density parity check (LDPC) coding;

comparing the CBS with at least one threshold;

determining, based on a result of the comparison, a Kb number that is an integer, wherein the Kb number is a first value when the CBS is greater than the at least one threshold and the Kb number is a second value when the CBS is less than or equal to the at least one threshold, the first value being different from the second value;

determining a Kp number that is an integer based on a code rate and the Kb number;

selecting a first section of a base matrix when the Kb number is the first value or a second section of the base matrix when the Kb number is the second value to generate a parity check matrix of the LDPC coding, an information portion of the parity check matrix being a first matrix formed by M number of second square matrices, M being equal to Kp multiplied by Kb, a total number of columns in the Kb number of second square matrices being equal to a total number of bits of the CBS, one or more matrices of the M number of second square matrices being circular permutation matrices;

generating the parity check matrix; and operating an LDPC encoder or an LDPC decoder based on the parity check matrix.

2. The method of claim 1, wherein the at least one threshold includes a first threshold of 640 bits, wherein the Kb number is determined to be 10 when the CBS is greater than the first threshold.

3. The method of claim 1, wherein the at least one threshold includes a first threshold of 640 bits and the second threshold of 560 bits, wherein the Kb number is determined to be 9 when the CBS is less than or equal to the first threshold and is greater than the second threshold.

4. The method of claim 1, wherein the at least one threshold includes a first threshold of 560 bits and the second threshold of 192 bits, wherein the Kb number is determined to be 8 when the CBS is less than or equal to the first threshold and is greater than the second threshold.

5. The method of claim 1, wherein the at least one threshold includes a first threshold of 192 bits, wherein the Kb number is determined to be 6 when the CBS is less than or equal to the first threshold.

6. The method of claim 1, wherein the circular permutation matrices are located at locations of the first matrix as indicated by an adopted base graph.

7. The method of claim 6, further comprising: selecting a first base graph or a second base graph to be the adopted base graph based on at least one the CBS and a code rate of an initial transmission.

8. The method of claim 7, wherein the second base graph is selected when the CBS is less than or equal to 3840 bits and the code rate is less than or equal to 0.67.

9. An apparatus for a wireless communication comprising:

a processor and a memory device coupled to the processor, the memory device containing a set of instructions that, when executed by the processor, cause the processor to:

determine a code block size (CBS) of information bits contained in a codeword of low-density parity check (LDPC) coding;

compare the CBS with at least one threshold;

determine, based on a result of the comparison, a Kb number that is an integer, wherein the Kb number is a first value when the CBS is greater than the at least one threshold and the Kb number is a second value when the CBS is less than or equal to the at least one threshold, the first value being different from the second value;

determine, based on a code rate and the Kb number, a Kp number that is an integer;

selecting a first section of a base matrix when the Kb number is the first value or a second section of the base matrix when the Kb number is the second value to generate a parity check matrix of the LDPC coding, an information portion of the parity check matrix being a first matrix formed by M number of second square matrices, M being equal to Kp multiplied by Kb, a total number of columns in the Kb number of second square matrices being equal to a total number of bits of the CBS, one or more matrices of the M number of second square matrices being circular permutation matrices;

generating the parity check matrix; and operate an LDPC encoder or an LDPC decoder based on the parity check matrix.

10. The apparatus of claim 9, wherein the at least one threshold includes a first threshold of 640 bits, wherein the Kb number is determined to be 10 when the CBS is greater than the first threshold.

11. The apparatus of claim 9, wherein the at least one threshold includes a first threshold of 640 bits and the second threshold of 560 bits, wherein the Kb number is determined to be 9 when the CBS is less than or equal to the first threshold and is greater than the second threshold.

12. The apparatus of claim 9, wherein the at least one threshold includes a first threshold of 560 bits and the second threshold of 192 bits, wherein the Kb number is determined to be 8 when the CBS is less than or equal to the first threshold and is greater than the second threshold.

13. The apparatus of claim 9, wherein the at least one threshold includes a first threshold of 192 bits, wherein the Kb number is determined to be 6 when the CBS is less than or equal to the first threshold.

14. The apparatus of claim 9, wherein the circular permutation matrices are located at locations of the first matrix as indicated by an adopted base graph.

15. The apparatus of claim 14, further comprising: selecting a first base graph or a second base graph to be the adopted base graph based on at least one the CBS and a code rate of an initial transmission.

16. The apparatus of claim 15, wherein the second base graph is selected when the CBS is less than or equal to 3840 bits and the code rate is less than or equal to 0.67.

17. A tangible, non-transitory, computer-readable media having software encoded thereon, the software, when executed by a processor, operable to:

determine a code block size (CBS) of information bits contained in a codeword of low-density parity check (LDPC) coding;

compare the CBS with at least one threshold;

determine, based on a result of the comparison, a Kb number that is an integer, wherein the Kb number is a first value when the CBS is greater than the at least one threshold and the Kb number is a second value when the CBS is less than or equal to the at least one threshold, the first value being different from the second value;

determining a Kp number that is an integer based on a code rate and the Kb number;

selecting a first section of a base matrix when the Kb number is the first value or a second section of the base matrix when the Kb number is the second value to generate a parity check matrix of the LDPC coding, an information portion of the parity check matrix being a formed by M number of second square matrices, M being equal to Kp multiplied by Kb, a total number of columns in the Kb number of second square matrices being equal to a total number of bits of the CBS, one or more matrices of the M number of second square matrices being circular permutation matrices;

generating the parity check matrix; and operate an LDPC encoder or an LDPC decoder based on the parity check matrix.

18. The computer-readable media of claim 17, wherein the at least one threshold includes a first threshold of 640 bits, wherein the Kb number is determined to be 10 when the CBS is greater than the first threshold.

19. The computer-readable media of claim 17, wherein the at least one threshold includes a first threshold of 640 bits and the second threshold of 560 bits, wherein the Kb number is determined to be 9 when the CBS is less than or equal to the first threshold and is greater than the second threshold.

20. The computer-readable media of claim 17, wherein the at least one threshold includes a first threshold of 560 bits and the second threshold of 192 bits, wherein the Kb number is determined to be 8 when the CBS is less than or equal to the first threshold and is greater than the second threshold.

* * * * *